(12) United States Patent
Maeda

(10) Patent No.: US 8,488,378 B2
(45) Date of Patent: Jul. 16, 2013

(54) NONVOLATILE SEMICONDUCTOR MEMORY DEVICE

(75) Inventor: Takashi Maeda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 88 days.

(21) Appl. No.: 13/301,948

(22) Filed: Nov. 22, 2011

(65) Prior Publication Data

US 2012/0243314 A1  Sep. 27, 2012

(30) Foreign Application Priority Data

Mar. 25, 2011  (JP) ................................. 2011-068889

(51) Int. Cl.
*G11C 11/34* (2006.01)

(52) U.S. Cl.
USPC ............ 365/185.05; 365/185.11; 365/185.17; 365/185.33; 257/288; 257/304; 257/326

(58) Field of Classification Search
USPC .............. 365/185.05, 185.11, 185.17, 185.33
See application file for complete search history.

(56) References Cited

U.S. PATENT DOCUMENTS

| | | | |
|---|---|---|---|
| 7,558,141 B2 | 7/2009 | Katsumata et al. | |
| 7,821,047 B2 * | 10/2010 | Ozaki | 257/295 |
| 7,936,004 B2 * | 5/2011 | Kito et al. | 257/324 |
| 8,120,961 B2 * | 2/2012 | Katsumata et al. | 365/185.18 |
| 8,148,769 B2 * | 4/2012 | Kito et al. | 257/321 |
| 8,169,826 B2 * | 5/2012 | Hishida et al. | 365/185.11 |
| 8,178,919 B2 * | 5/2012 | Fujiwara et al. | 257/324 |
| 8,194,467 B2 * | 6/2012 | Mikajiri et al. | 365/185.29 |
| 8,217,446 B2 * | 7/2012 | Fukuzumi et al. | 257/324 |
| 8,228,733 B2 * | 7/2012 | Tokiwa et al. | 365/185.11 |
| 8,247,863 B2 * | 8/2012 | Fukuzumi et al. | 257/324 |
| 8,313,998 B2 * | 11/2012 | Satonaka et al. | 438/268 |
| 8,318,602 B2 * | 11/2012 | Kito et al. | 438/675 |
| 8,320,182 B2 * | 11/2012 | Kirisawa et al. | 365/185.17 |
| 8,338,876 B2 * | 12/2012 | Kito et al. | 257/315 |
| 8,395,206 B2 * | 3/2013 | Lee et al. | 257/324 |
| 2010/0118610 A1 | 5/2010 | Katsumata et al. | |
| 2010/0207195 A1 | 8/2010 | Fukuzumi et al. | |
| 2012/0069661 A1 * | 3/2012 | Iwai | 365/185.11 |
| 2012/0069663 A1 * | 3/2012 | Itagaki et al. | 365/185.11 |
| 2012/0134210 A1 * | 5/2012 | Maeda | 365/185.11 |

OTHER PUBLICATIONS

H. Tanaka et al., "Bit Cost Scalable Technology with Punch and Plug Process for Ultra High Density Flash Memory", 2007 Symposium on VLSI Technology Digest of Technical Papers, 2007, pp. 14-15.

(Continued)

*Primary Examiner* — Viet Q Nguyen
(74) *Attorney, Agent, or Firm* — Oblon, Spivak, McClelland, Maier & Neustadt, L.L.P.

(57) ABSTRACT

A nonvolatile semiconductor memory device according to one aspect includes a semiconductor substrate, a memory string, a plurality of first conductive layers, a second conductive layer, and a third conductive layer. The memory string has a plurality of memory cells, a dummy transistor and a back gate transistor connected in series in a direction perpendicular to the semiconductor substrate. The plurality of first conductive layers are electrically connected to gates of the memory cells. The second conductive layer is electrically connected to a gate of the dummy transistor. The third conductive layer is electrically connected to a gate of the back gate transistor. The second conductive layer is short-circuited with the third conductive layer.

20 Claims, 19 Drawing Sheets

OTHER PUBLICATIONS

Ryota Katsumata et al., "Pipe-Shaped BiCS Flash Memory with 16 Stacked Layers and Multi-Level-Cell Operation for Ultra High Density Storage Devices", 2009 Symposium on VLSI Technology Digest of Technical Papers, 2009, pp. 136-137.

Takashi Maeda et al., "Multi-Stacked 1G Cell/Layer Pipe-Shaped BiCS Flash Memory", 2009 Symposium on VLSI Circuits Digest of Technical Papers, pp. 22-23.

* cited by examiner

FIG. 10 FIRST EMBODIMENT

FIG. 12

|  |  | READ | PROGRAM | ERASE 1 | ERASE 2 | ERASE 3 |
|---|---|---|---|---|---|---|
| MB(select) | BL | Vbl | Vdd/Vss | Vera | Vebl | Vera |
|  | SL(select) | Vss | Vdd | Vera | Vera | Vera |
|  | SL(unselect) | --- | --- | --- | Vebl | --- |
|  | WL(select) | Vref | Vpgm | Vss | Vss | Vss |
|  | WL(unselect) | Vread | Vpass | --- | --- | --- |
|  | DDWL | Vread | Vpmid | Vemid | Vera | Vemid |
|  | SDWL | Vread | Vpmid | Vemid | Vemid | Vemid |
|  | BG | Vread | Vpmid | Vemid | Vemid | Vemid |
|  | SGD(select) | Vsg | Vdd | Verag | Vebl | Verag |
|  | SGD(unselect) | Vss | Vss | --- | Vebl | Vera |
|  | SGS(select) | Vsg | Vss | Verag | Verag | Verag |
|  | SGS(unselect) | Vss | Vss | --- | Vebl | Vera |
| MB(unselect) | WL | Floating | Floating | Floating | Floating | Floating |
|  | DDWL | Floating | Floating | Floating | Floating | Floating |
|  | SDWL | Floating | Floating | Floating | Floating | Floating |
|  | BG | Floating | Floating | Floating | Floating | Floating |
|  | SGD | Vss | Vss | Floating | Floating | Floating |
|  | SGS | Vss | Vss | Floating | Floating | Floating |

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-68889, filed on Mar. 25, 2011, the entire contents of which are incorporated herein by reference.

FIELD

Embodiments described herein relate to a nonvolatile semiconductor memory device capable of electrically rewriting data.

BACKGROUND

In recent years, in order to enhance a degree of integration of a memory, there has been proposed a semiconductor memory device (3D semiconductor memory device) in which memory cells are three-dimensionally arranged.

In the 3D semiconductor memory device as described above, a memory block as erase unit is generally larger in size than a planar semiconductor memory device (planar NAND flash memory).

If the block size is larger, interchangeability with the planar semiconductor memory device is difficult to keep and thus a system design of a memory controller needs to be changed. Consequently, the 3D semiconductor memory device needs to be configured such that the memory block as erase unit is made smaller in size.

BRIEF DESCRIPTION OF THE DRAWINGS

FIG. 12 is a diagram showing various operations of the nonvolatile semiconductor memory device according to the first embodiment.

DETAILED DESCRIPTION

A nonvolatile semiconductor memory device according to an aspect includes a semiconductor substrate, a memory string, a plurality of first conductive layers, a second conductive layer, and a third conductive layer. The memory string has a plurality of memory cells, a dummy transistor and a back gate transistor connected in series in the direction perpendicular to the semiconductor substrate. The first conductive layers are electrically connected to gates of the memory cells. The second conductive layer is electrically connected to a gate of the dummy transistor. The third conductive layer is electrically connected to a gate of the back gate transistor. The second conductive layer is short-circuited with the third conductive layer.

One embodiment of the nonvolatile semiconductor memory device will be described below with reference to the drawings.

It will be understood that when an element is referred to as being "electrically connected to" another element, it can be not only directly connected but also connected to the other element or intervening elements may be present.

[First Embodiment]

Figure 1:
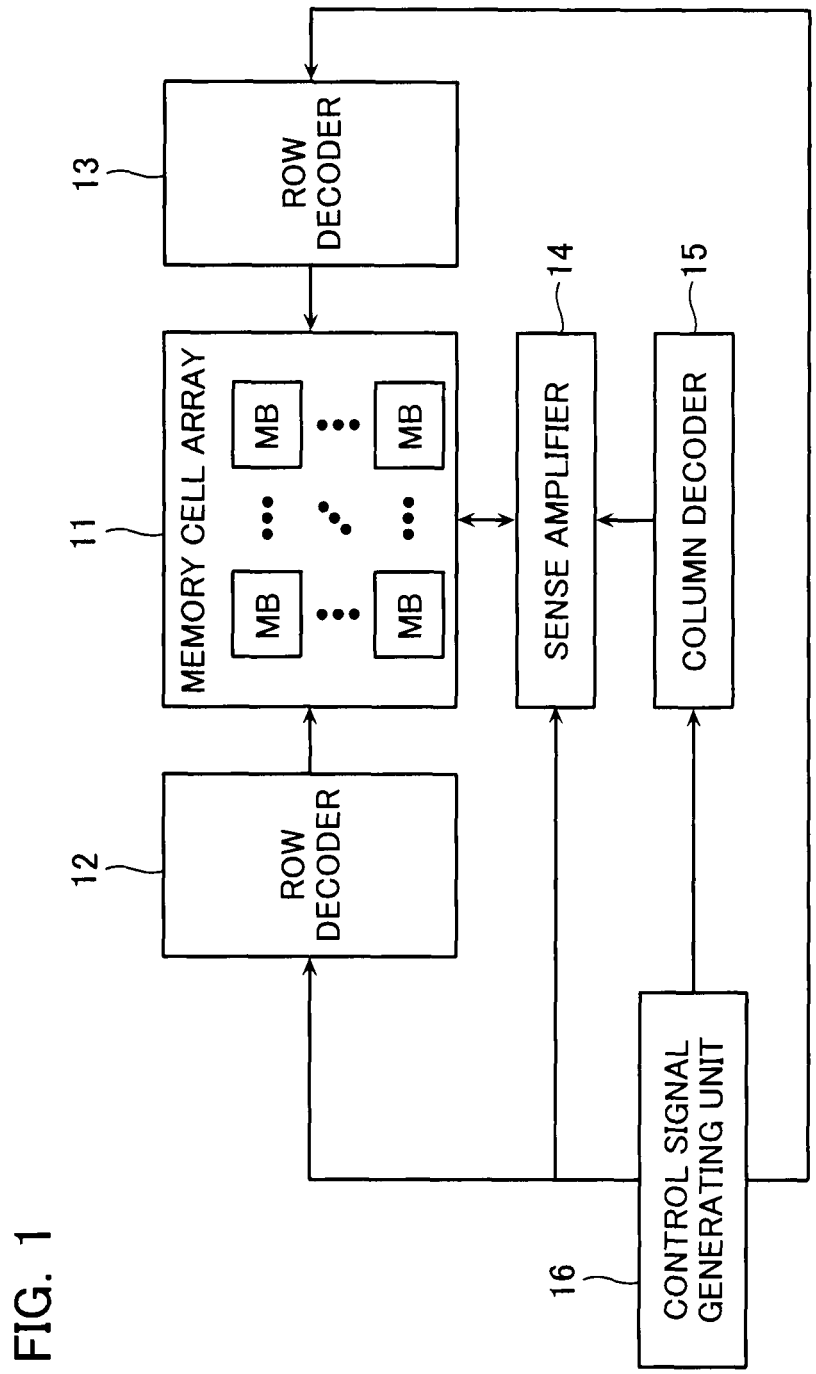
FIG. 1 is a block diagram of a nonvolatile semiconductor memory device according to a first embodiment.

A structure of a nonvolatile semiconductor memory device according to a first embodiment will be first described with reference to FIG. 1. FIG. 1 is a block diagram of the nonvolatile semiconductor memory device according to the first embodiment.

The nonvolatile semiconductor memory device according to the first embodiment includes a memory cell array 11, row decoders 12 and 13, a sense amplifier 14, a column decoder 15 and a control signal generating unit 16 as shown in FIG. 1.

The memory cell array 11 has a plurality of memory blocks MB as shown in FIG. 1. Each memory block MB has a plurality of memory transistors MTr (memory cells) arranged in a 3D matrix. Each memory block MB configures a minimum erase unit to be collectively erased when a data erase operation is performed. The memory transistors MTr are arranged in a matrix (3D) in the row direction, the column direction and the stack direction.

The row decoders 12 and 13 decode, for example, a block address signal input from the control signal input unit 16, and controls the memory cell array 11 as shown in FIG. 1. The sense amplifier 14 reads data from the memory cell array 11. The column decoder 15 decodes a column address signal and controls the sense amplifier 14. The control signal generating unit 16 boosts a reference voltage, generates a high voltage needed for a program operation or erase operation, and further generates a control signal to control the row decoders 12 and 13, the sense amplifier 14 and the column decoder 15.

A specific structure of the memory block MB will be described below with reference to FIG. 2. The memory block MB has a plurality of memory units MU.

The memory unit MU is connected at one end to a bit line BL and is connected at the other end to a source line SL. The bit lines BL are formed to be arranged in the row direction and to extend in the column direction. The bit lines BL are formed to be shared between the memory blocks MB. The source lines SL are formed to extend in the row direction and in the column direction. In one memory block MB, the memory units MU are arranged in a matrix in the row direction and the column direction. The memory unit MU has a memory string MS, a source side select transistor SSTr and a drain side select transistor SDTr. In the first embodiment, in one memory block MB, L memory units MU are arranged in the row direction, and M memory units MU are arranged in the column direction.

Figure 2:
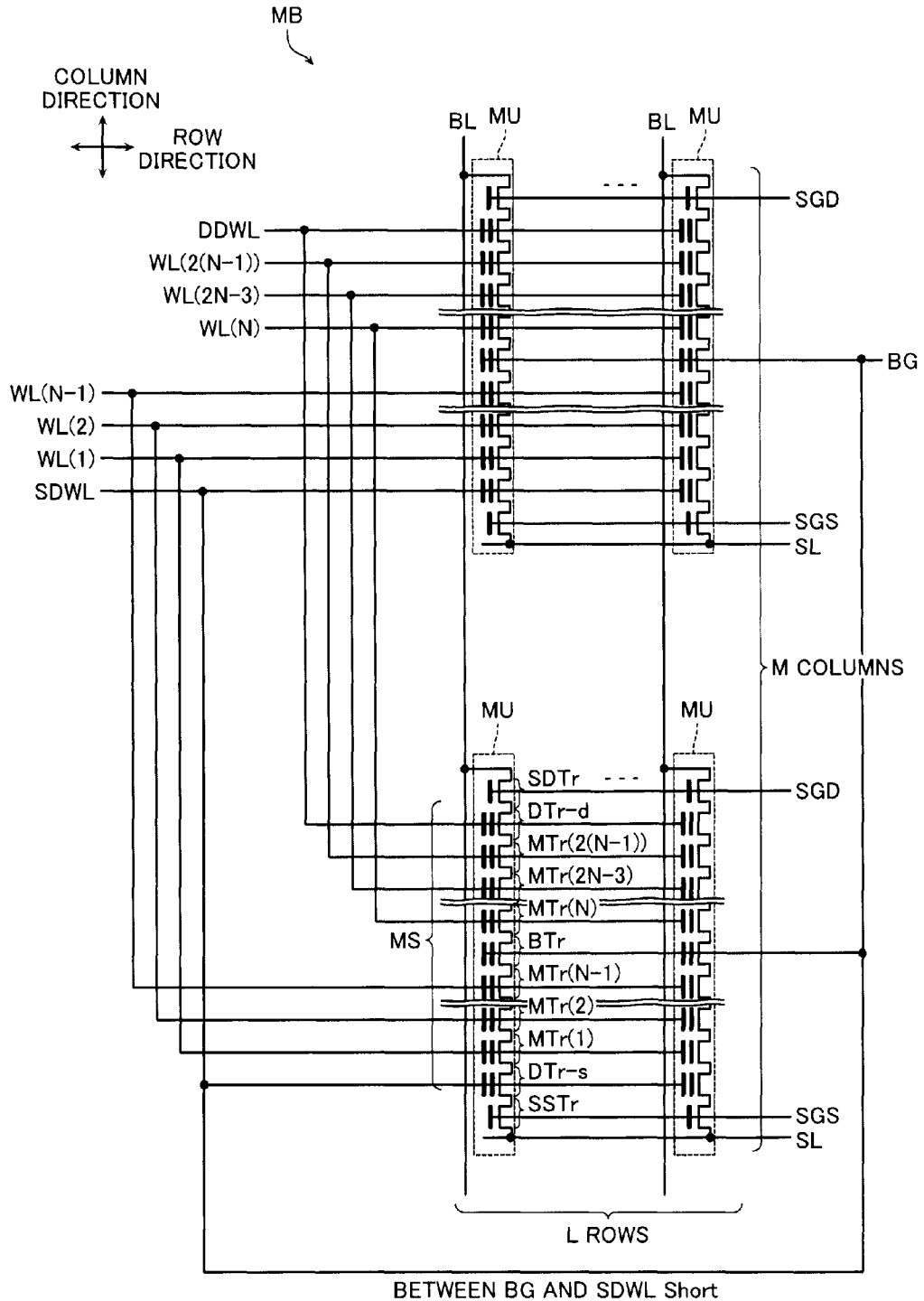
FIG. 2 is a circuit diagram of a memory block MB according to the first embodiment.

The memory string MS has memory transistors MTr(1) to MTr(2(N−1)), dummy transistors DTr-s and DTr-d, and a back gate transistor BTr connected in series as shown in FIG. 2. The memory transistors MTr(1) to MTr(2(N−1)), the dummy transistors DTr-s and DTr-d, and the back gate transistor BTr are arranged in the direction perpendicular to the semiconductor substrate. One memory string MS is folded at the position of the back gate transistor BTr (at the middle position of the memory string MS) and has a U shape in the cross-section direction.

The memory transistors MTr(1) to MTr(N−1), MTr(N) to MTr(2(N−1)) function as memory cells for storing data therein, and are interconnected in series. The dummy transistors DTr-s and DTr-d have substantially the same structure as the memory transistor MTr but are not used for storing data. A drain of the dummy transistor DTr-s is connected to a source of the memory transistor MTr(1) and a source of the dummy transistor DTr-d is connected to a drain of the memory transistor MTr(2(N−1)). The back gate transistor BTr is connected between the memory transistor MTr(N−1) and the memory transistor MTr(N).

The memory transistors MTr(1) to MTr(2(N−1)) store charges in a charge storage layer thereby to change a threshold voltage, and hold data depending on the threshold voltage.

A word line WL(1) is commonly connected to the gates of the memory transistors MTr(1) arranged in a matrix of L rows×M columns in one memory block MB. Similarly, the word lines WL(2) to WL(2(N−1)) are commonly connected to the gates of the memory transistors MTr(2) to MTr(2(N−1)), respectively, arranged in a matrix in one memory block MB.

Dummy word lines SDWL and DDWL are commonly connected to the gates of the dummy transistors DTr-s and DTr-d, respectively, arranged in a matrix of L rows×M columns in one memory block MB. A back gate line BG is commonly connected to the gates of the back gate transistors BTr arranged in L rows×M columns. In the first embodiment, the back gate line BG and the dummy word line SDWL are short-circuited. As described in detail later, the short-circuit allows the size of the memory block MB to be smaller in the first embodiment.

A drain of the source side select transistor SSTr is connected to a source of the dummy transistor DTr-s. A source of the source side select transistor SSTr is connected to the source line SL. One source side select gate line SGS is commonly connected to the gates of the source side select transistors SSTr arranged in one line in the row direction.

A source of the drain side select transistor SDTr is connected to a drain of the dummy transistor DTr-d. A drain of the drain side select transistor SSTr is connected to the bit line BL. A drain side select gate line SGD is commonly connected to the gates of the drain side select transistors SDTr arranged in one line in the row direction.

Figure 3:
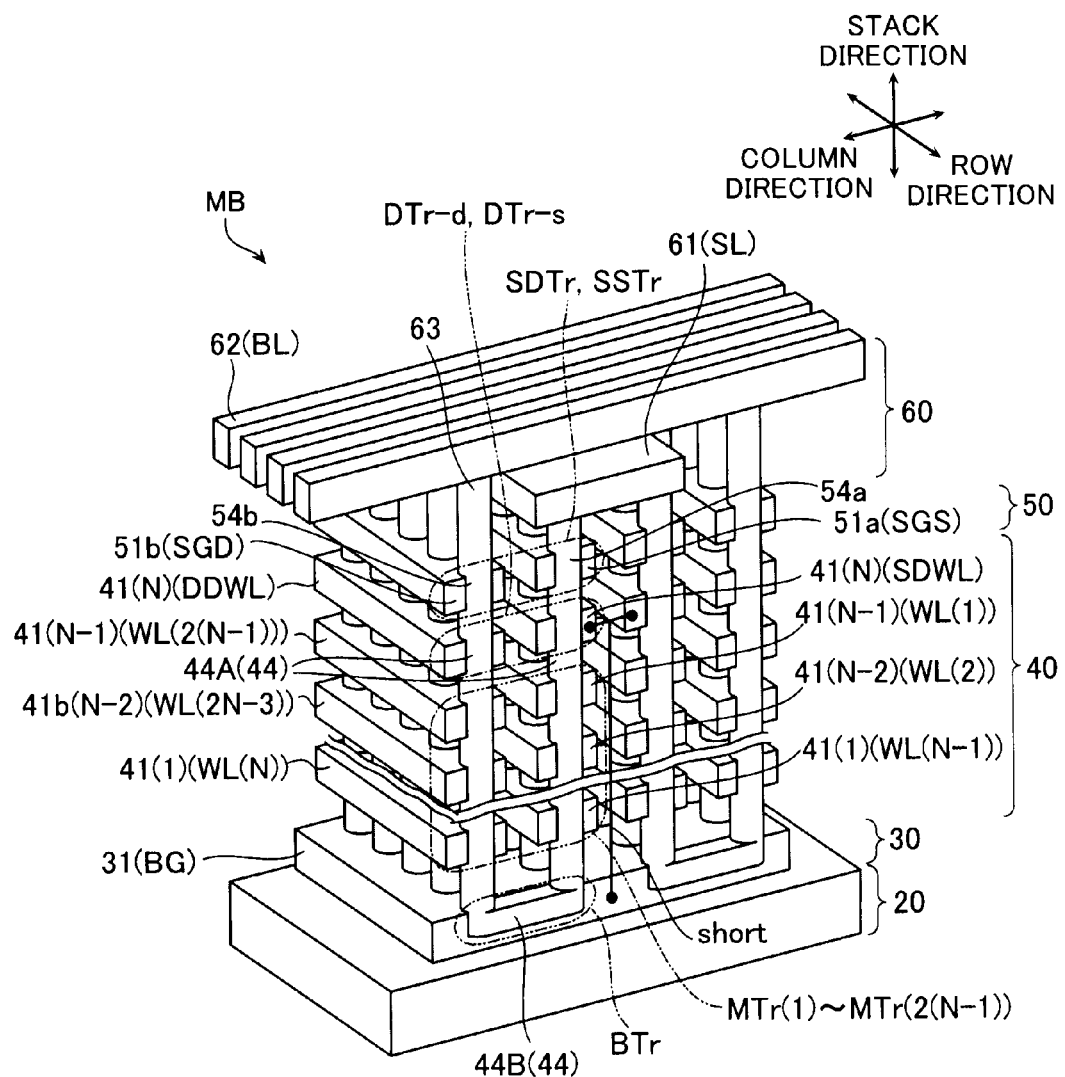
FIG. 3 is a schematic perspective view of the memory block MB according to the first embodiment.
Figure 4:
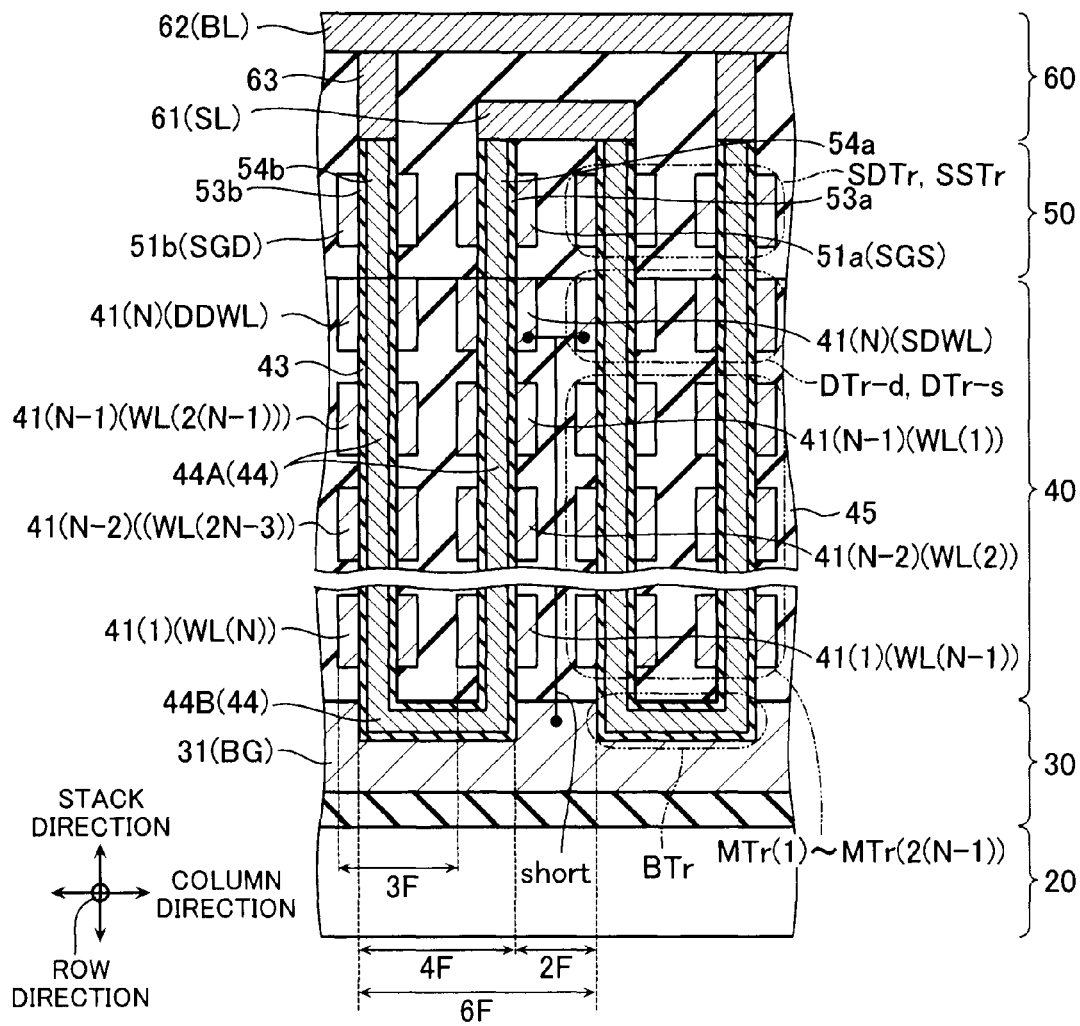
FIG. 4 is a cross-sectional view of the memory block MB according to the first embodiment.

A structure of the memory cell array according to the first embodiment will be described below with reference to FIGS. 3 and 4. FIGS. 3 and 4 show a representative memory block MB. The memory blocks MB share the bit lines BL and are repeatedly formed in the column direction.

One memory block MB has a back gate layer 30, a memory layer 40, a select transistor layer 50 and a wiring layer 60 sequentially stacked on a substrate 20 as shown in FIGS. 3 and 4. The back gate layer 30 functions as the back gate transistor BTr. The memory layer 40 functions as the memory transistors MTr(1) to MTr(2(N−1)) and the dummy transistors DTr-s and DTr-d. The select transistor layer 50 functions as the drain side select transistor SDTr and the source side select transistor SSTr. The wiring layer 60 functions as the source lines SL and the bit lines BL.

The back gate layer 30 has a back gate conductive layer 31 as shown in FIGS. 3 and 4. The back gate conductive layer 31 functions as the back gate line BG and the gate of the back gate transistor BTr. The back gate conductive layer 31 is formed to spread in a 2D plate shape in the row direction and the column direction parallel to the substrate 20. The back gate conductive layer 31 is made of a material such as polysilicon (poly-Si).

The back gate layer 30 has a memory gate insulative layer 43 and a joining semiconductor layer 44B as shown in FIG. 4. The memory gate insulative layer 43 is provided between the joining semiconductor layer 44B and the back gate conductive layer 31. The joining semiconductor layer 44B functions as a body (channel) of the back gate transistor BTr. The joining semiconductor layer 44B is formed to cut into the back gate conductive layer 31. The joining semiconductor layer 44B is formed in a substantially rectangular shape with the column direction viewed from the top surface as the longitudinal direction. The joining semiconductor layer 44B is formed in a matrix in the row direction and the column direction in one memory block MB. The joining semiconductor layer 44B is made of a material such as polysilicon (poly-Si).

The memory layer 40 is formed on the top of the back gate layer 30 as shown in FIGS. 3 and 4. The memory layer 40 has N word line conductive layers 41(1) to 41(N). The word line conductive layer 41(1) functions as the word line WL(N−1) and the gate of the memory transistor MTr(N−1). The word line conductive layer 41(1) also functions as the word line WL(N) and the gate of the memory transistor MTr(N). Similarly, the word line conductive layers 41(2) to 41(N−1) function as the word lines WL(N−2) to WL(1) and the gates of the memory transistors MTr(N−2) to MTr(1), respectively. The word line conductive layers 41(2) to 41(N−1) function as the word lines WL(N) to WL(2(N−1)) and the gates of the memory transistors MTr(N) to MTr(2(N−1)), respectively. The word line conductive layer 41(N) functions as the dummy word line SDWL and the gate of the dummy transistor DTr-s. The word line conductive layer 41(N) functions as the dummy word line DWL and the gate of the dummy transistor DTr-d.

The word line conductive layers 41(1) to 41(N) are vertically stacked to sandwich an interlayer insulative layer 45. The word line conductive layers 41(1) to 41(N) are formed to extend at a pitch of 3F in the column direction with the row direction (the direction perpendicular to the sheet of FIG. 4) as the longitudinal direction. The word line conductive layers 41(1) to 41(N) are made of a material such as polysilicon (poly-Si). The word line conductive layer 41(N) functioning as the dummy word line SDWL is short-circuited with the back gate conductive layer 31.

The memory layer 40 has the memory gate insulative layer 43 and columnar semiconductor layers 44A as shown in FIG. 4. The memory gate insulative layer 43 is provided between the columnar semiconductor layer 44A and the word line conductive layers 41(1) to 41(N). The columnar semiconductor layer 44A functions as the bodies (channels) of the memory transistors MTr(1) to MTr(2N−1) and the bodies (channels) of the dummy transistors DTr-s and DTr-d. The columnar semiconductor layer 44A is formed to penetrate through the word line conductive layers 41(1) to 41(N) and the interlayer insulative layer 45. The columnar semiconductor layer 44A extends in the direction perpendicular to the substrate 20. A pair of columnar semiconductor layers 44A is formed to match near the end of the joining semiconductor layer 44B in the column direction. The columnar semiconductor layer 44A is made of a material such as polysilicon (poly-Si).

In other words, in the back gate layer 30 and the memory layer 40, a pair of columnar semiconductor layers 44A and the joining semiconductor layer 44B joining the lower ends thereof configure a memory semiconductor layer 44 functioning as a body (channel) of the memory string MS. The memory semiconductor layer 44 is formed in a U shape viewed in the row direction.

When the diameter of the columnar semiconductor layer 44A is processed with a minimum process dimension F, the memory semiconductor layers 44 are arranged at a pitch of 6F in the column direction. A distance between the columnar semiconductor layers 44A in the column direction is 2F. The memory semiconductor layers 44 each have a length of 4F in the column direction and are arranged at an interval of 2F in the column direction. For simplified description, the "diameter of the columnar semiconductor layer 44A" is assumed to include the thickness of the memory gate insulative layer 43.

In other words, the back gate layer 30 is structured such that the back gate conductive layer 31 is formed to surround the sides and the bottom surface of the joining semiconductor layer 44B via the memory gate insulative layer 43. In other words, the memory layer 40 is structured such that the word line conductive layers 41(1) to 41(N) are formed to surround the sides of the columnar semiconductor layer 44A via the memory gate insulative layer 43.

The select transistor layer 50 has a source side conductive layer 51a and a drain side conductive layer 51b as shown in FIGS. 3 and 4. The source side conductive layer 51a functions as the source side select gate line SGS and the gate of the source side select transistor SSTr. The drain side conductive layer 51b functions as the drain side select gate line SGD and the gate of the drain side select transistor SDTr.

The source side conductive layer 51a is formed above one columnar semiconductor layer 44A configuring the memory semiconductor layer 44. The drain side conductive layer 51b is in the same layer as the source side conductive layer 51a and is formed above the other columnar semiconductor layer 44A configuring the memory semiconductor layer 44. The source side conductive layers 51a and the drain side conductive layers 51b are formed to extend in the row direction at a pitch of 3F in the column direction. The source side conductive layers 51a and the drain side conductive layers 51b are made of a material such as polysilicon (poly-Si).

As shown in FIG. 4, the select transistor layer 50 has a source side gate insulative layer 53a, a source side columnar semiconductor layer 54a, a drain side gate insulative layer 53b and a drain side columnar semiconductor layer 54b. The source side columnar semiconductor layer 54a functions as the body (channel) of the source side select transistor SSTr. The drain side columnar semiconductor layer 54b functions as the body (channel) of the drain side select transistor SDTr.

The source side gate insulative layer 53a is provided between the source side conductive layer 51a and the source side columnar semiconductor layer 54a. The source side columnar semiconductor layer 54a is formed to penetrate through the source side conductive layer 51a. The source side columnar semiconductor layer 54a is connected to the side of the source side gate insulative layer 53a and the top of one of the pair of columnar semiconductor layers 44A, and is formed in a column shape to extend in the direction perpendicular to the substrate 20. The source side columnar semiconductor layer 54a is made of a material such as polysilicon (poly-Si).

The drain side gate insulative layer 53b is provided between the drain side conductive layer 51b and the drain side columnar semiconductor layer 54b. The drain side columnar semiconductor layer 54b is formed to penetrate through the drain side conductive layer 51b. The drain side columnar semiconductor layer 54b is connected to the side of the drain side gate insulative layer 53b and the top of the other of the pair of columnar semiconductor layers 44A, and is formed in a column shape to extend in the direction perpendicular to the substrate 20. The drain side columnar semiconductor layer 54b is made of a material such as polysilicon (poly-Si).

The wiring layer 60 has a source line layer 61, a bit line layer 62 and a plug layer 63. The source line layer 61 functions as the source line SL. The bit line layer 62 functions as the bit line BL.

The source line layer 61 contacts with the top surface of the source side columnar semiconductor layer 54a and is formed to extend in the row direction. The bit line layer 62 contacts with the top surface of the drain side columnar semiconductor layer 54b via the plug layer 63, and is formed to extend in the column direction. The source line layer 61, the bit line layer 62 and the plug layer 63 are made of a metal material such as tungsten.

Figure 5:
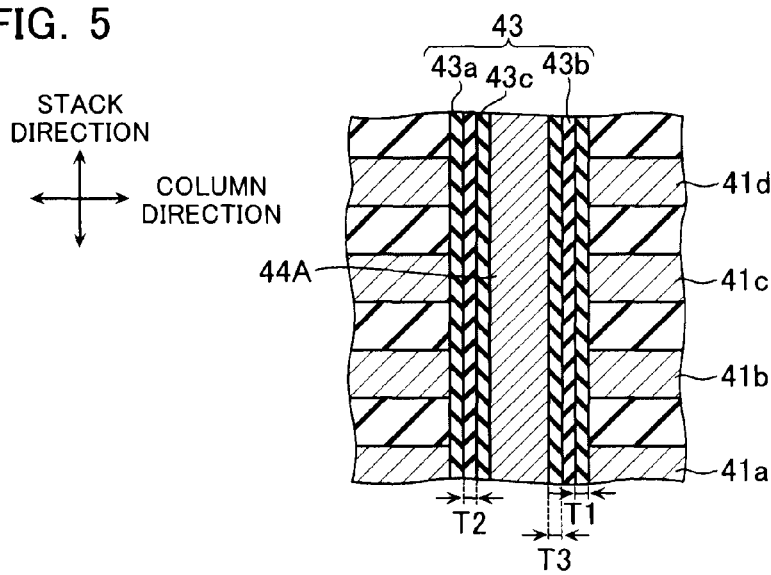
FIG. 5 is an enlarged view of FIG. 4.

A structure of the memory gate insulative layer 43 will be described below in detail with reference to FIG. 5. FIG. 5 is an enlarged view of FIG. 4. The memory gate insulative layer 43 has a block insulative layer 43a, a charge storage layer 43b and a tunnel insulative layer 43c from the sides of the word line conductive layers 41(1) to 41(N) toward the columnar semiconductor layer 44A. The charge storage layer 43b is configured to store charges.

The block insulative layer 43a is formed with a thickness T1 on the sides of the word line conductive layers 41(1) to 41(N) as shown in FIG. 5. The charge storage layer 43b is formed with a thickness T2 on the side of the block insulative layer 43a. The tunnel insulative layer 43c is formed with a thickness T3 on the side of the charge storage layer 43b. The block insulative layer 43a and the tunnel insulative layer 43c are made of silicon oxide ($SiO_2$). The charge storage layer 43b is made of silicon nitride (SiN).

Specific shapes of the back gate conductive layer 31 and the word line conductive layers 41(1) to 41(N) will be described below with reference to FIG. 6.

Figure 6:
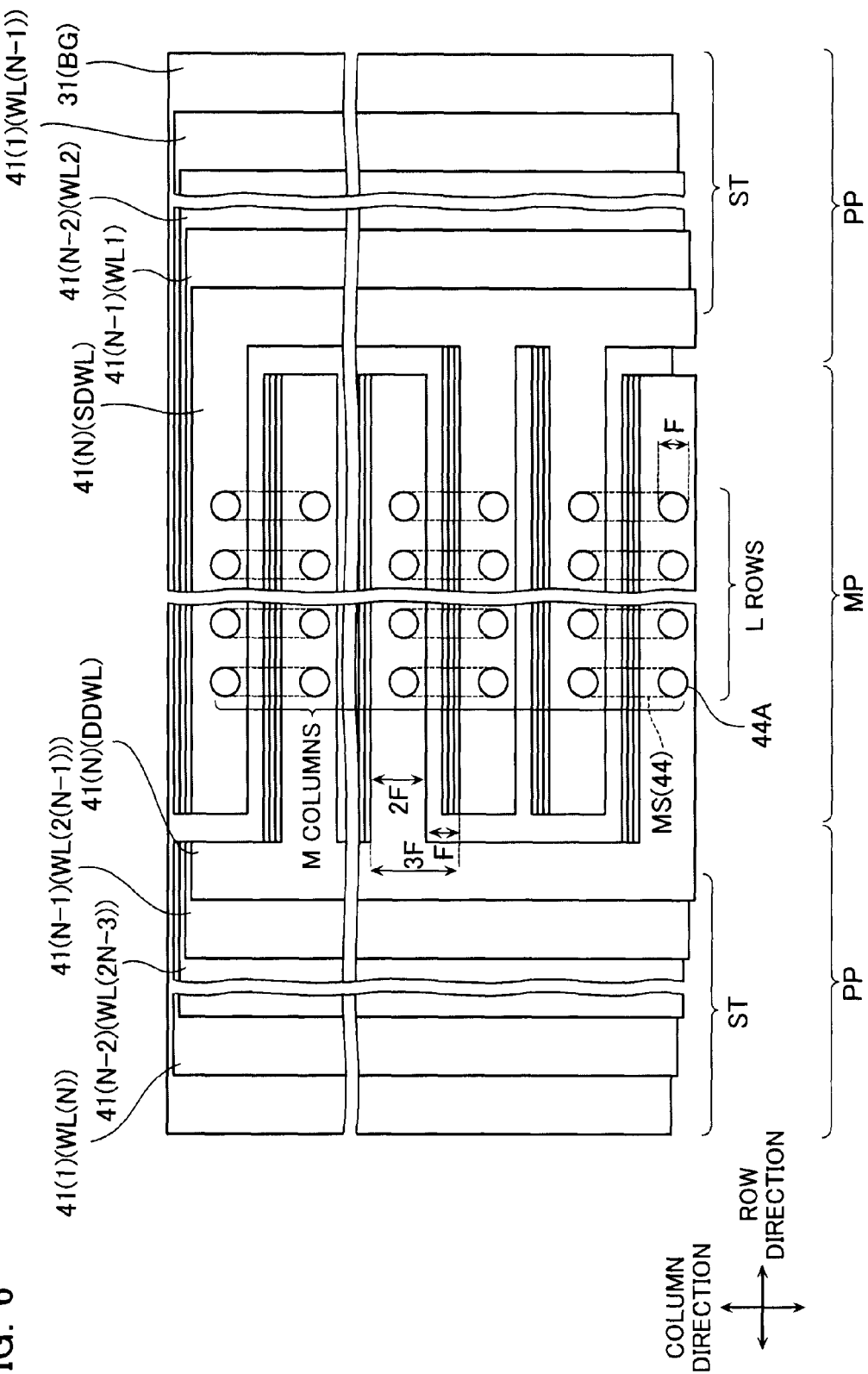
FIG. 6 is a top view showing a back gate conductive layer 31 and word line conductive layers 41(1) to 41(N) according to the first embodiment.

As shown in FIG. 6, the back gate conductive layer 31 is formed in a plate shape to spread in the row direction and in the column direction over the memory block MB.

As shown in FIG. 6, the word line conductive layers 41(1) to 41(N) are arranged to mesh each other horizontally, like a pair combs. The word line conductive layers 41(1) to 41(N) each have a plurality of meshing parts MP and common connection parts PP.

The meshing parts MP are each formed to surround the sides of the columnar semiconductor layers 44A arranged in the row direction via the memory gate insulative layer 43, and function as the word line WL and the dummy word line DDWL or SDWL.

By way of example, when the diameter of the columnar semiconductor layer 44A is set at a minimum process dimension F, the meshing part MP has a width of 2F in the column direction. The meshing part MP is formed in a rectangular shape to extend in the row direction viewed from above. The meshing parts MP are arranged in the column direction at an interval of F in the column direction.

The common connection part PP is formed to join the ends of the meshing parts MP with each other. The ends of the common connection parts PP of the word line conductive layers 41(1) to 41(N) constitute stairway portions ST formed stepwise such that ends of the word line conductive layers 41(1) to 41(N) are located at different positions in the row direction. The stairway portion ST is connected to an upper wiring layer 71 described later via a plug layer P.

Specific shapes of the source side conductive layer 51a and the drain side conductive layer 51b will be described below with reference to FIG. 7.

Figure 7:
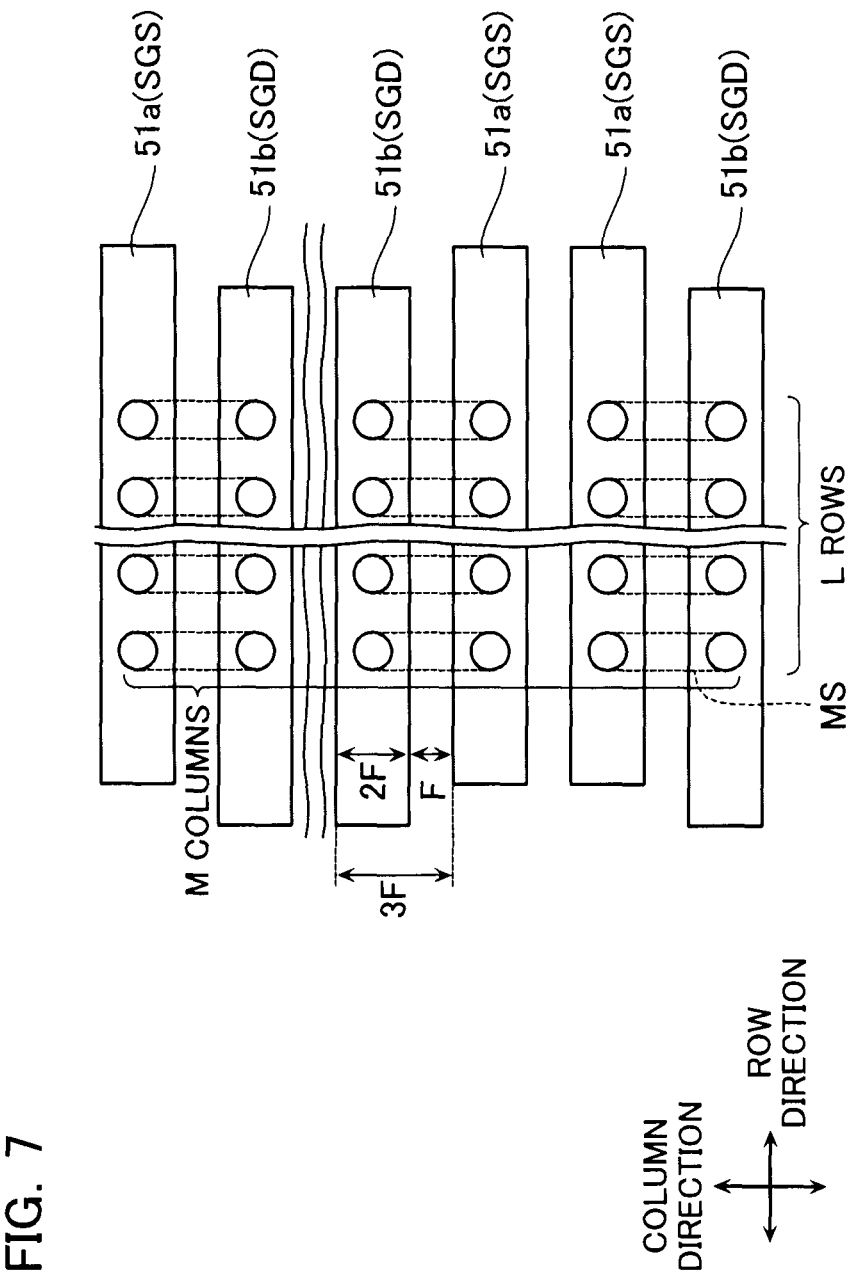
FIG. 7 is a top view showing source side conductive layers 51a and drain side conductive layers 51b according to the first embodiment.

As shown in FIG. 7, M source side conductive layers 51a and M drain side conductive layers 51b are provided for M memory semiconductor layers 44 arranged in the column direction in one memory block MB.

The source side conductive layers 51a (the source side select gate lines SGS) and the drain side conductive layers 51b (the drain side select gate lines SGD) extend in a stripe shape in the row direction at a pitch of 3F in the column direction. The source side conductive layers 51a and the drain side conductive layers 51b are arranged at an interval of F in length with a width of 2F in length in the column direction.

[Advantages]

Advantages of the first embodiment will be described below with reference to FIGS. 8 to 11. A comparative example is different from the first embodiment only in that the back gate line BG and the dummy word line SDWL are not short-circuited (not shown).

Figure 8:
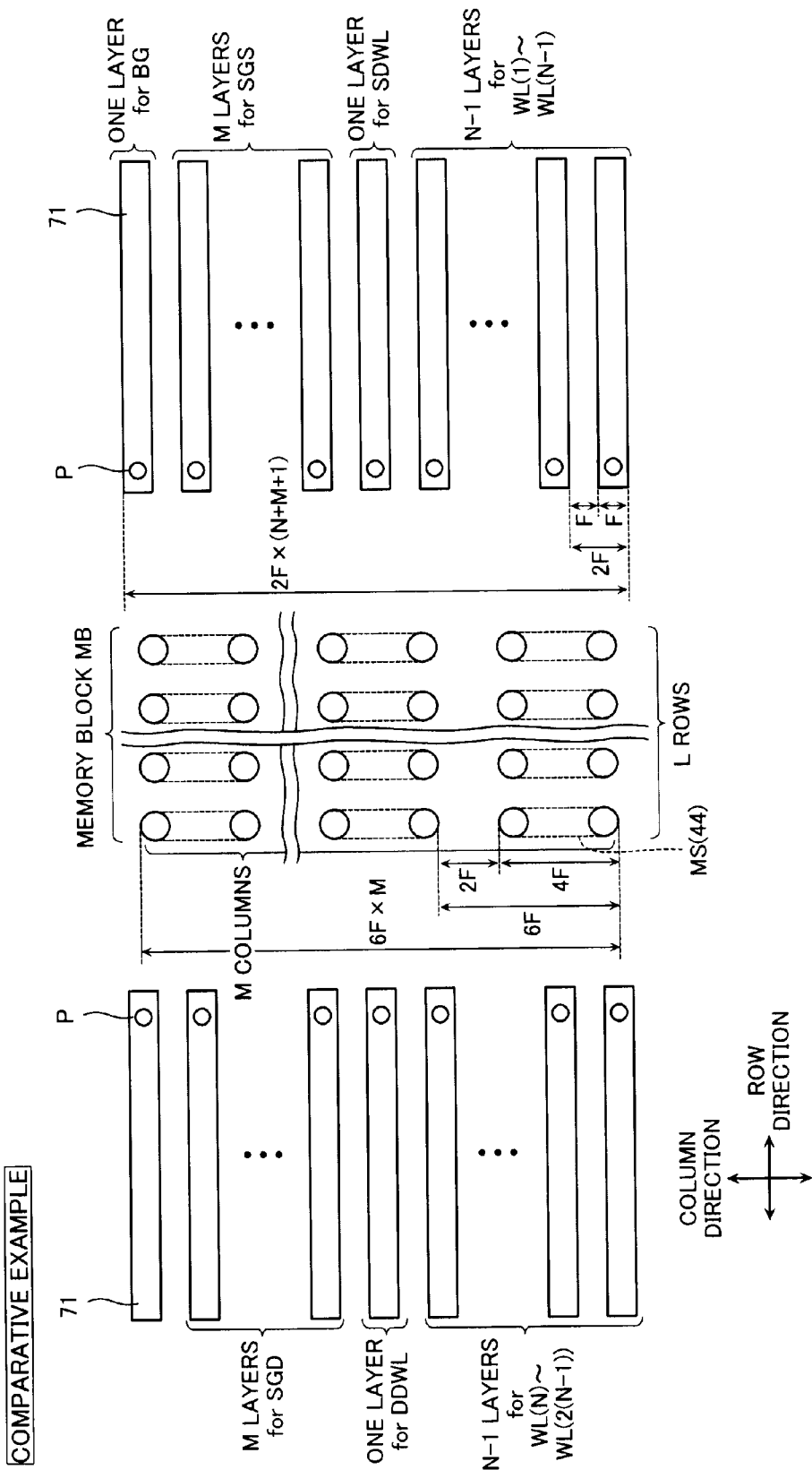
FIG. 8 is a diagram showing a relationship between the number of upper wiring layers 71 and the size of the memory block MB according to a comparative example.

The upper wiring layers 71 are connected to the conductive layers functioning as various wirings WL(1) to WL(2(N−1)), SDWL, DDWL, BG, the source side gate lines SGS and the drain side gate lines SGD via the plug layers P as shown in FIG. 8. The upper wiring layers 71 are formed above the wiring layer 60. The upper wiring layers 71 extend in a stripe shape in the row direction at a pitch of 2F in the column direction. The upper wiring layer 71 has a width of F in length in the column direction. The upper wiring layers 71 are formed to extend from both ends of the memory block MB in the row direction toward the conductive layers functioning as various wirings. The plug layers P extend in the direction perpendicular to the substrate 20.

As shown in FIG. 8, 2(N−1) word lines WL are provided in one memory block MB, and thus (N−1) upper wiring layers 71 are needed for both ends of the memory block MB in the row direction for connecting thereto, respectively. Since M source side select gate liens SGS and M drain side select gate lines SGD are provided in one memory block MB, M upper wiring layers 71 are needed for both ends of the memory block MB in the row direction for connecting thereto, respectively. Since one dummy word line SDWL and one dummy word line DDWL are provided in one memory block MB, one upper wiring layer 71 is needed for both ends of the memory block MB in the row direction for connecting thereto, respectively. Since one back gate line BG is provided in one memory block MB, one upper wiring layer 71 is needed at one end of the memory block MB in the row direction for connecting thereto.

As described above, (N+M+1) upper wiring layers 71 are needed for one end of one memory block MB. Since the upper wiring layers 71 are arranged at a pitch of 2F in the column direction, a space of 2F×(N+M+1) in length in the column direction is needed for the (N+M+1) upper wiring layers 71.

On the other hand, M memory strings MS (memory semiconductor layers 44) are provided in the column direction in one memory block MB and the memory strings MS are arranged at a pitch of 6F in the column direction. Thus, a space of 6F×M in length in the column direction is needed for the memory strings MS.

In order to limit the size of the memory block MB, the space (2F×(N+M+1)) needed for the upper wiring layers 71 needs to be housed in the space (6F×M) needed for the memory strings MS described above. That is, the equation (1) needs to be met.

$$6F \times M \geq 2F \times (N+M+1)\ldots \qquad \text{(equation 1)}$$

Figure 9:
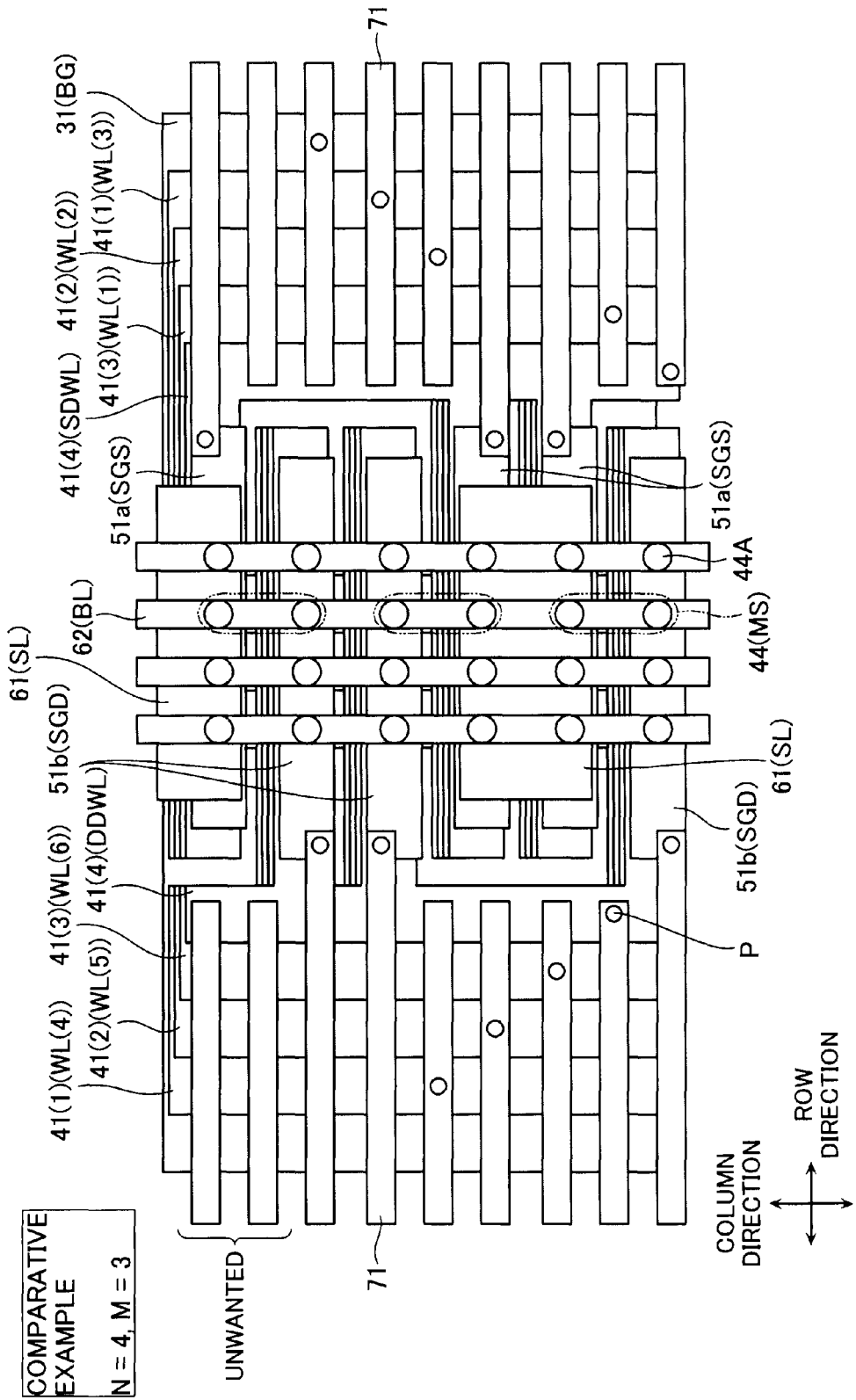
FIG. 9 is a top view of the comparative example in the case of N=4 and M=3.

In the equation (1), in the case of N=4, M=3 is obtained. In other words, the memory block MB according to the comparative example needs a space of 6F×3 in length at minimum in the column direction in the case of N=4. The top view of the comparative example in the case of N=4 and M=3 is shown in FIG. 9. As shown in FIG. 9, in the comparative example, unwanted upper wiring layers 71, which are connected to no wiring, are formed.

Figure 10:
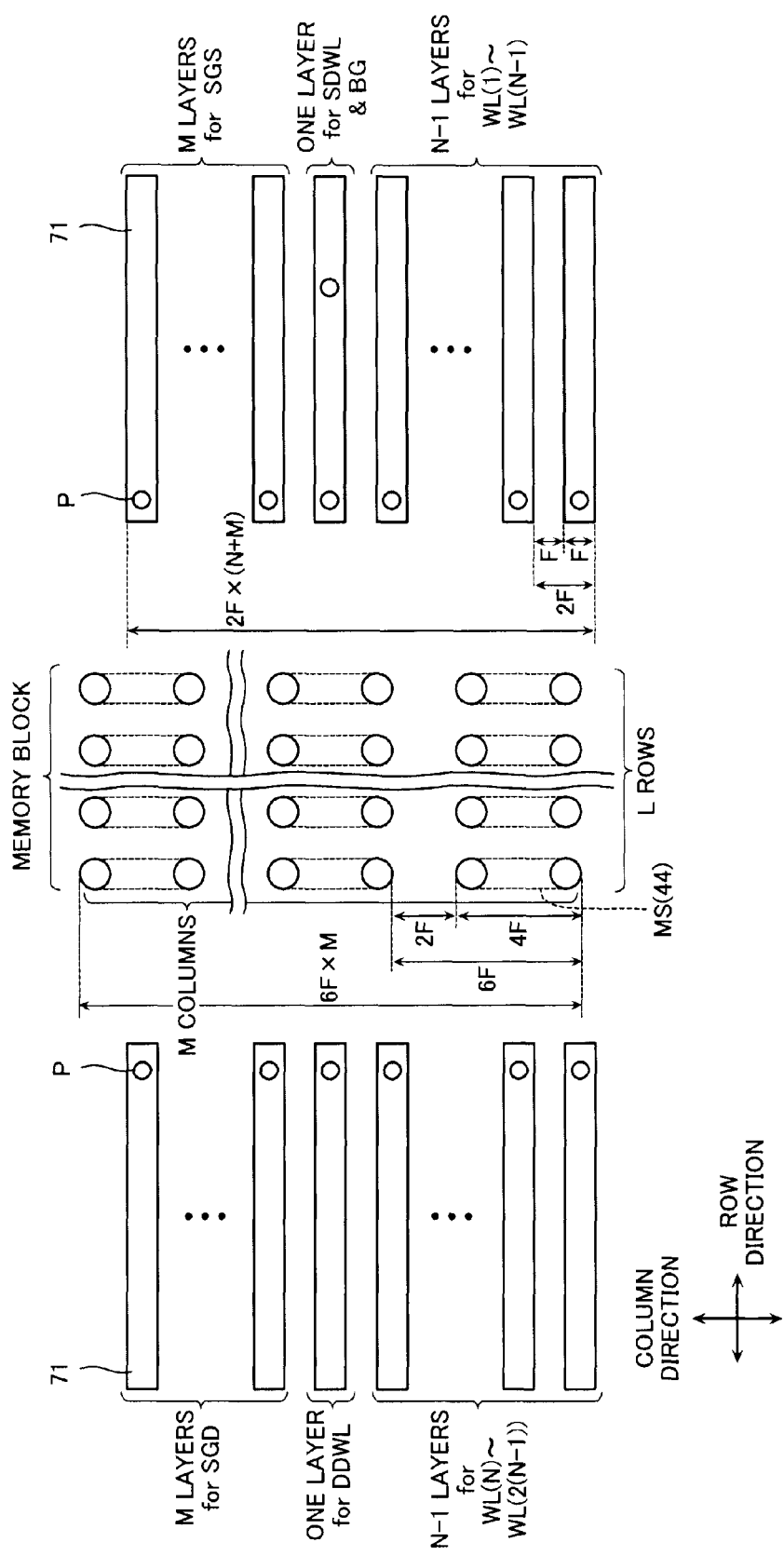
FIG. 10 is a diagram showing a relationship between the number of upper wiring layers 71 and the size of the memory block MB according to the first embodiment.

The first embodiment will be described below with reference to FIG. 10. In the first embodiment, the back gate line BG and the dummy word line SDWL are short-circuited. Consequently, unlike the comparative example, a common upper wiring layer 71 only needs to be provided for the back gate line BG and the dummy word line SDWL in the first embodiment as shown in FIG. 10. Specifically, the upper wiring layer 71 is connected to the back gate conductive layer 31 (back gate line BG) via the plug layer P, and is connected to the word line conductive layer 41(N) (dummy word line SDWL) via another plug layer P. Thus, in the first embodiment, the number of necessary upper wiring layers 71 is smaller by one than the comparative example, and the condition for limiting the size of the memory block MB can be expressed as the equation (2).

$$6F \times M \geq 2F \times (N+M)\ldots \qquad \text{(equation 2)}$$

Figure 11:
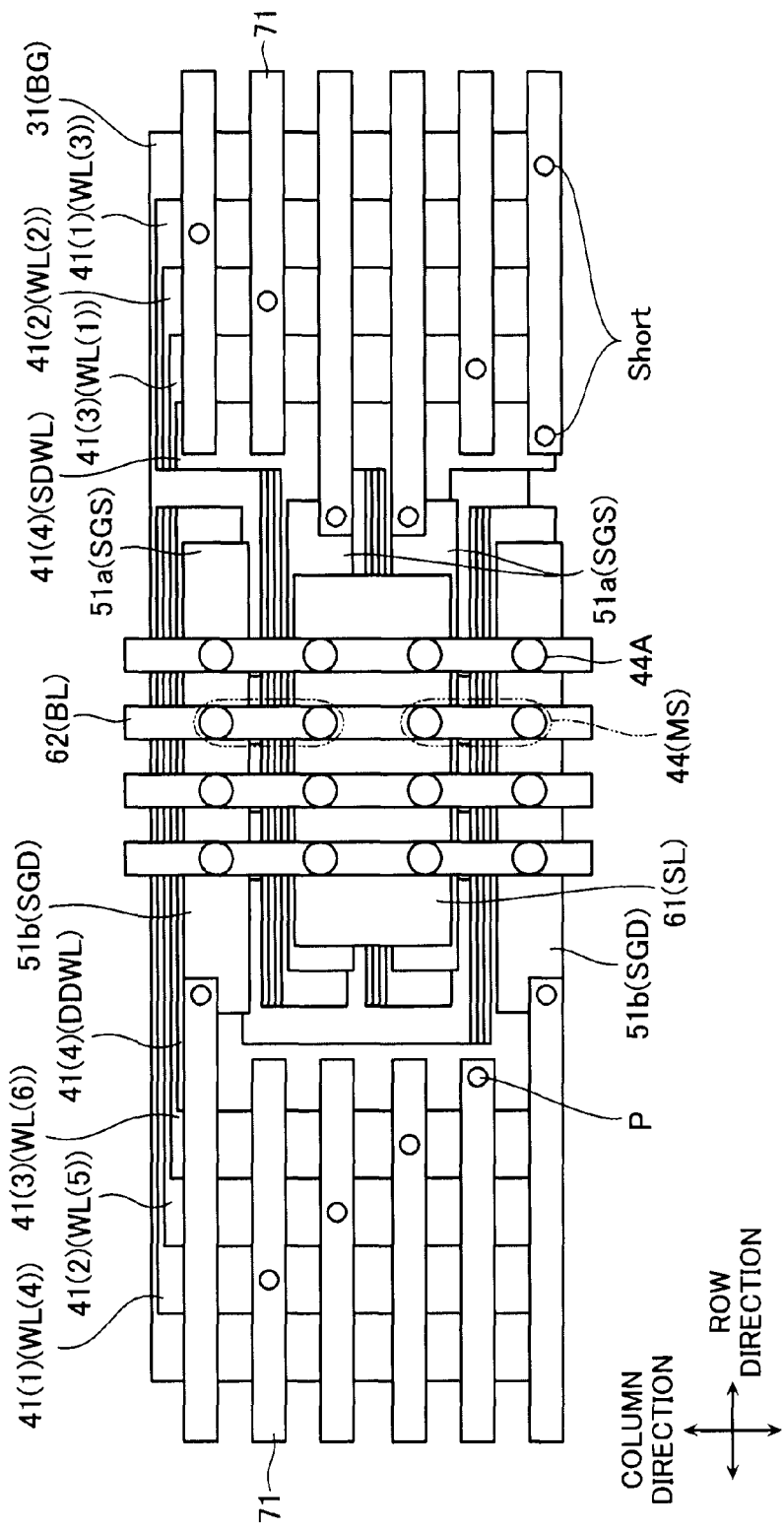
FIG. 11 is a top view of the first embodiment in the case of N=4 and M=2.

In the equation (2), the case of N=4, M=2 is obtained. In other words, in the case of N=4, the memory block MB according to the first embodiment needs a space of 6F×2 in length at minimum in the column direction. Thus, in the first embodiment, the size of the memory block MB can be made smaller by 6F in the column direction than the comparative example. The top view of the comparative example in the case of N=4 and M=2 is shown in FIG. 11. As shown in FIG. 11, in the first embodiment, unwanted upper wiring layers 71 are not formed, unlike the comparative example.

[Operations of Nonvolatile Semiconductor Memory Device]

Various operations of the nonvolatile semiconductor memory device according to the first embodiment will be described below with reference to FIG. 12.

A read operation (READ) for reading data in a selected memory transistor MTr will be first described with reference to FIG. 12. As shown in FIG. 12, during the read operation, the bit line BL is charged at a voltage Vbl and the source line SL is set at a ground voltage Vss.

In a selected memory block MB, a read voltage Vref is applied to a selected word line WL. The read voltage Vref is a voltage between two threshold voltage distributions which the memory transistor MTr may have.

A read pass voltage Vread is applied to a non-selected word line WL, the dummy word lines SDWL and DDWL, and the back gate line BG. The read pass voltage Vread is a voltage capable of making the non-selected memory transistor MTr conductive irrespective of the data held in the non-selected memory transistor MTr.

A voltage Vsg is applied to a selected drain side select gate line SGD and a selected source side select gate line SGS. The voltage Vss is applied to a non-selected drain side select gate line SGD and a non-selected source side select gate line SGS. The voltage Vsg is a voltage for making the source side select transistor SSTr and the drain side select transistor SDTr conductive. The voltage Vss is a voltage for making the source side select transistor SSTr and the drain side select transistor SDTr non-conductive. By the above control, a current flows from the bit lines BL to the source lines SL depending on the data in the selected memory transistor MTr. Thereby, the data is read.

On the other hand, the word line WL, the dummy word lines SDWL and DDWL, and the back gate line BG are floating in a non-selected memory block MB. The voltage Vss is applied to the source side select gate line SGS and the drain side select gate line SGD. Thereby, a current does not flow from the bit line BL to the source line SL in the non-selected memory block MB.

An operation of programming data in a selected memory transistor MTr (PROGRAM) will be described below with reference to FIG. 12. The program operation is for programming, for example, binary data in the selected memory transistor MTr. As shown in FIG. 12, during the program operation, the bit line BL is applied with a voltage Vdd or Vss depending on, for example, the binary data to be programmed in the memory transistor MTr. The voltage Vdd is applied to the source line SL.

In the selected memory block MB, a voltage Vpgm is applied to the selected word line WL. The voltage Vpgm is for injecting charges in the charge storage layer of the selected memory transistor MTr.

A voltage Vpass is applied to the non-selected word line WL in the selected memory block MB. The voltage Vpass is a voltage capable of making the non-selected memory transistor MTr conductive irrespective of the data held in the non-selected memory transistor MTr. A voltage Vpmid is applied to the dummy word lines SDWL and DDWL, and the back gate line BG. The voltage Vpmid is a voltage for making the dummy transistors DTr-s and DTr-d, and the back gate transistor BTr conductive. The selected drain side select gate line SGD is applied with the voltage Vdd. The voltage Vdd is a voltage for making the drain side select transistor SDTr conductive when the potential of the bit line BL is Vss and making the drain side select transistor SDTr non-conductive when the potential of the bit line BL is Vdd. The voltage Vss is applied to the non-selected drain side select gate line SGD and the source side select gate line SGS. The voltage Vss is for making the drain side select transistor SDTr and the source side select transistor SSTr non-conductive.

By the above control, charges are injected to the charge storage layer of the selected memory transistor MTr so that the data may be programmed. A similar control to the read operation is performed in the operation of programming the non-selected memory block MB and thus an explanation thereof will be omitted. A write operation is performed by the program operation and a verify operation.

A first erase operation (ERASE1) will be described below with reference to FIG. 12. The first erase operation is for erasing data for all the memory strings MS in the memory block MB. The first erase operation generates a GIDL current near the gate of the source side select transistor SSTr and near the gate of the drain side select transistor SDTr. As shown in FIG. 12, a voltage Vera is applied to the bit line BL during the first erase operation. The voltage Vera is applied to the source line SL.

A voltage of the word line WL is set at the voltage Vss in the selected memory block MB. A voltage Verag is applied to the drain side select gate line SGD and the source side select gate line SGS. A voltage Vemid is applied to the dummy word lines DDWL and SDWL, and the back gate line BG. The voltage Verag is smaller than the voltage Vera. The voltage Vemid is between the voltage Verag and the voltage Vss. Alternatively, the voltage Vemid is smaller than the voltage Verag.

By the above control, the GIDL current occurs based on a potential difference between the voltage Vera of the source line SL and the voltage Verag of the source side select gate line SGS. Also, the GIDL current occurs based on a potential difference between the voltage Vera of the bit line BL and the voltage Verag of the drain side select gate line SGD. A voltage of the body of the memory string MS increases due to the GIDL current. The data erase is performed due to a potential difference between the gate of the memory transistor MTr set at the voltage Vss and the body of the memory string MS.

A second erase operation (ERASE2) will be described below with reference to FIG. 12. The second erase operation is for erasing data only for the memory string MS (hereinafter, selected memory string MS) connected to the selected source line SL, the selected drain side select gate line SGD and the selected source side select gate line SGS. The second erase operation generates the GIDL current only near the gate of the source side select transistor SSTr. As shown in FIG. 12, a voltage Vebl is applied to the bit line BL during the second erase operation. The selected source line SL is applied with the voltage Vera. The non-selected source line SL is applied with the voltage Vebl.

A voltage of the word line WL is set at the voltage Vss in the selected memory block MB. The dummy word line DDWL is applied with the voltage Vera. The voltage Vebl is applied to the selected drain side select gate line SGD, the non-selected drain side select gate line SGD and the non-selected source side select gate line SGS. The selected source side select gate line SGS is applied with the voltage Verag. The dummy word line SDWL and the back gate line BG are applied with the voltage Vemid.

By the above control, the GIDL current occurs due to a potential difference between the voltage Vera of the selected source line SL and the voltage Verag of the selected source side select gate line SGS. The voltage of the body of the selected memory string MS increases due to the GIDL current. The data erase is performed due to a potential difference between the gate of the memory transistor MTr set at the voltage Vss and the body of the selected memory string MS.

A third erase operation (ERASE3) will be described below with reference to FIG. 12. The third erase operation is for erasing data for the selected memory string MS connected to the selected drain side select gate line SGD and the selected source side select gate line SGS in the memory block MB. The third erase operation generates the GIDL current near the gate of the source side select transistor SSTr and near the gate of the drain side select transistor SDTr. As shown in FIG. 12, the voltage Vera is applied to the bit line BL during the third erase operation. The voltage Vera is applied to the source line SL.

A voltage of the word line WL is set at the voltage Vss in the selected memory block MB. The voltage Verag is applied to the selected drain side select gate line SGD and the selected source side select gate line SGS. The voltage Vera is applied to the non-selected drain side select gate line SGD and the non-selected source side select gate line SGS. The voltage Vemid is applied to the dummy word lines DDWL and SDWL, and the back gate line BG.

By the above control, the GIDL current occurs due to a potential difference between the voltage Vera of the source line SL and the voltage Verag of the selected source side select gate line SGS. The GIDL current occurs due to a potential difference between the voltage Vera of the source line SL and the voltage Verag of the selected drain side select gate line SGD. The voltage of the body of the memory string MS increases due to the GIDL current. The data erase is performed due to a potential difference between the gate of the memory transistor MTr set at the voltage Vss and the body of the memory string MS.

[Second Embodiment]

A nonvolatile semiconductor memory device according to a second embodiment will be described below. In the second embodiment, similar constituents to those in the first embodiment are denoted with like reference numerals and an explanation thereof will be omitted.

Figure 13:
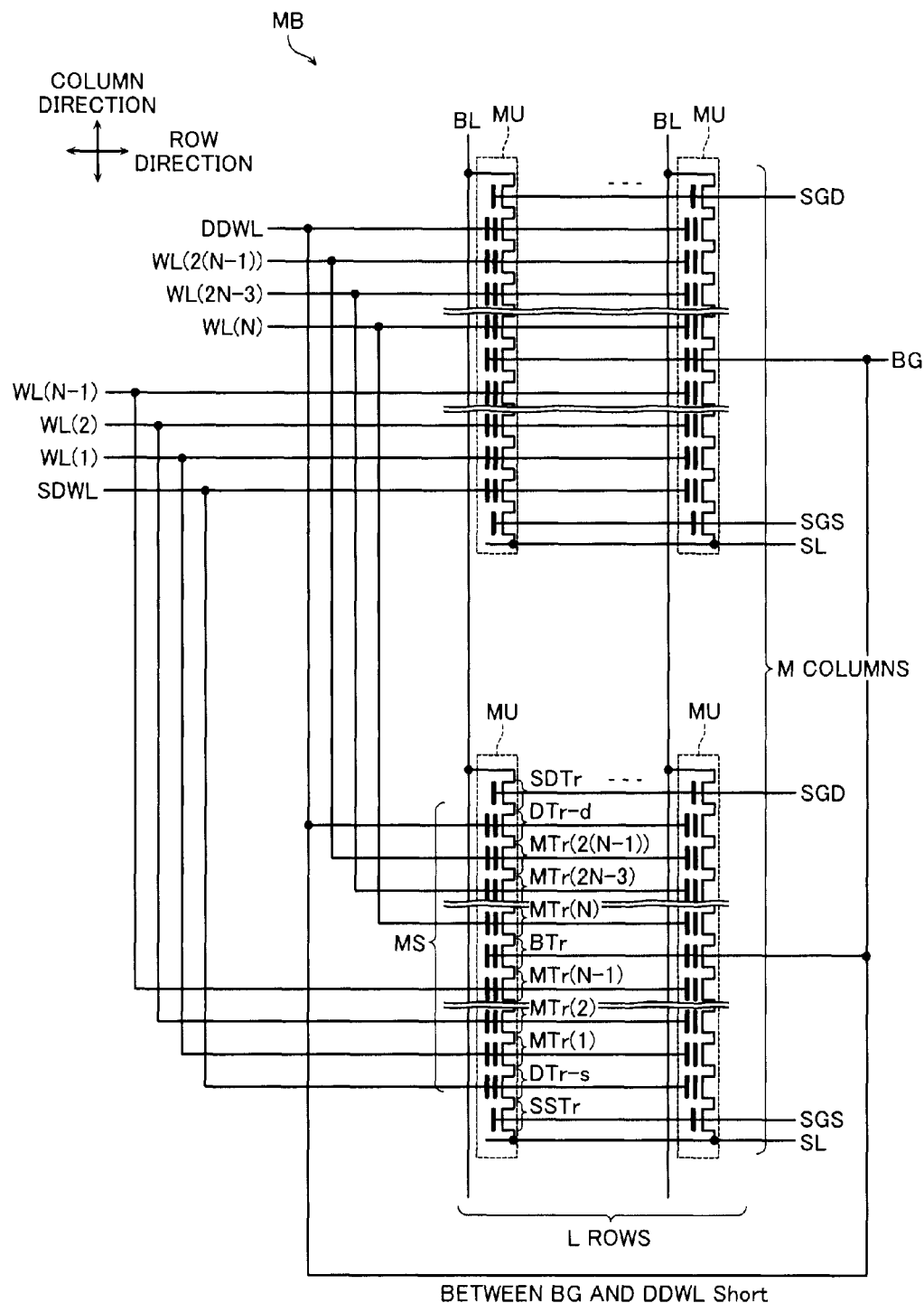
FIG. 13 is a circuit diagram of a memory block MB according to a second embodiment.

In the second embodiment, as shown in FIG. 13, the dummy word line SDWL and the back gate line BG are not short-circuited and the dummy word line DDWL and the back gate line BG are short-circuited. The second embodiment is different from the first embodiment only in this point.

Therefore, similar to the first embodiment, one upper wiring layer 71 is needed for the back gate line BG and the dummy word line DDWL. Thus, the second embodiment can make the memory block MB smaller in size like the first embodiment. In the second embodiment, the read operation, the program operation, and the first and third erase operations are performed similarly as in the first embodiment.

[Third Embodiment]

A nonvolatile semiconductor memory device according to a third embodiment will be described below. In the third embodiment, similar constituents to those in the first and second embodiments are denoted with like reference numerals and an explanation thereof will be omitted.

Figure 14:
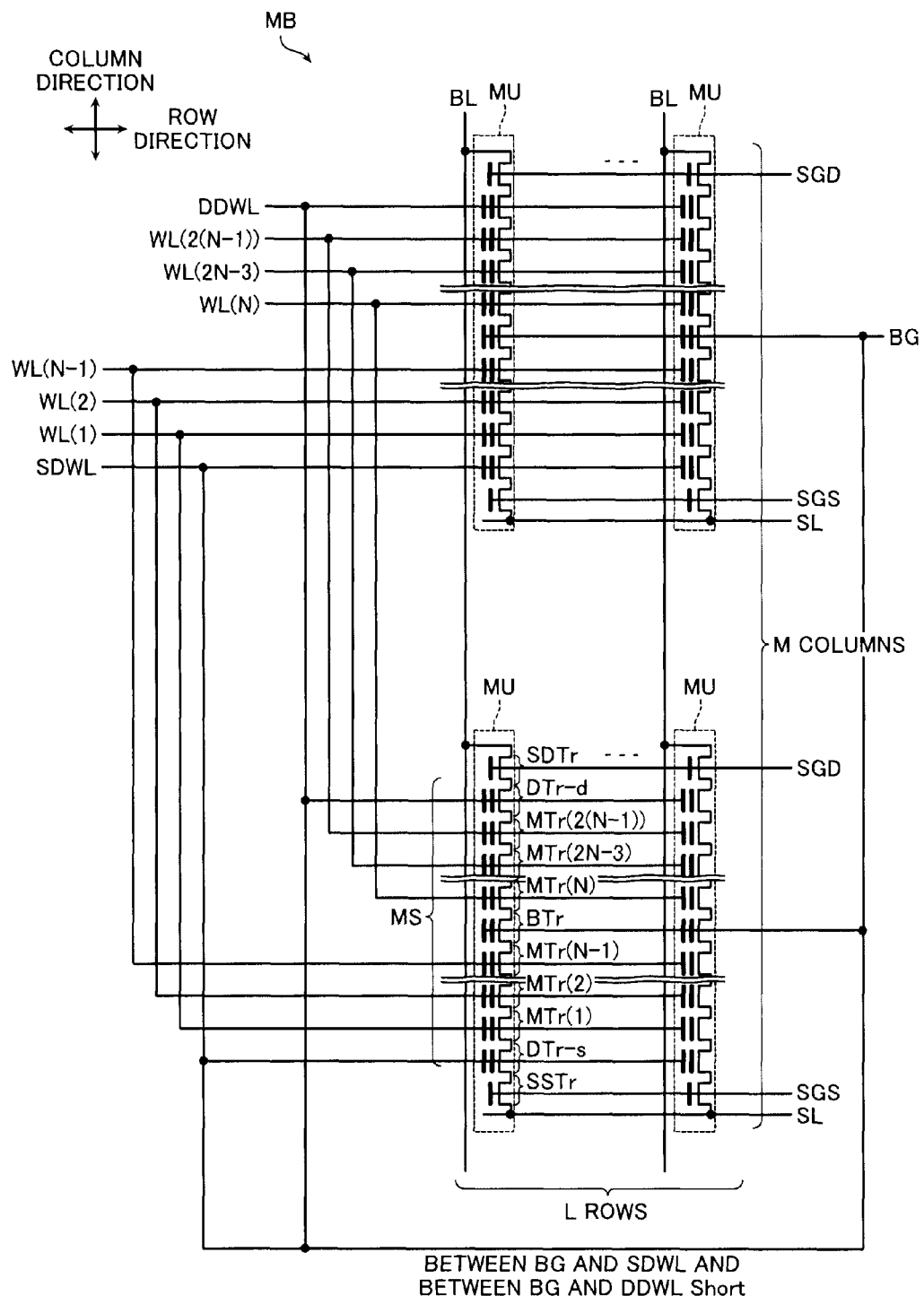
FIG. 14 is a circuit diagram of a memory block MB according to a third embodiment.

In the third embodiment, as shown in FIG. 14, the dummy word line SDWL and the back gate line BG are short-circuited similar to the first embodiment. In the third embodiment, the dummy word line DDWL and the back gate line BG are short-circuited similar to the second embodiment.

Figure 15:
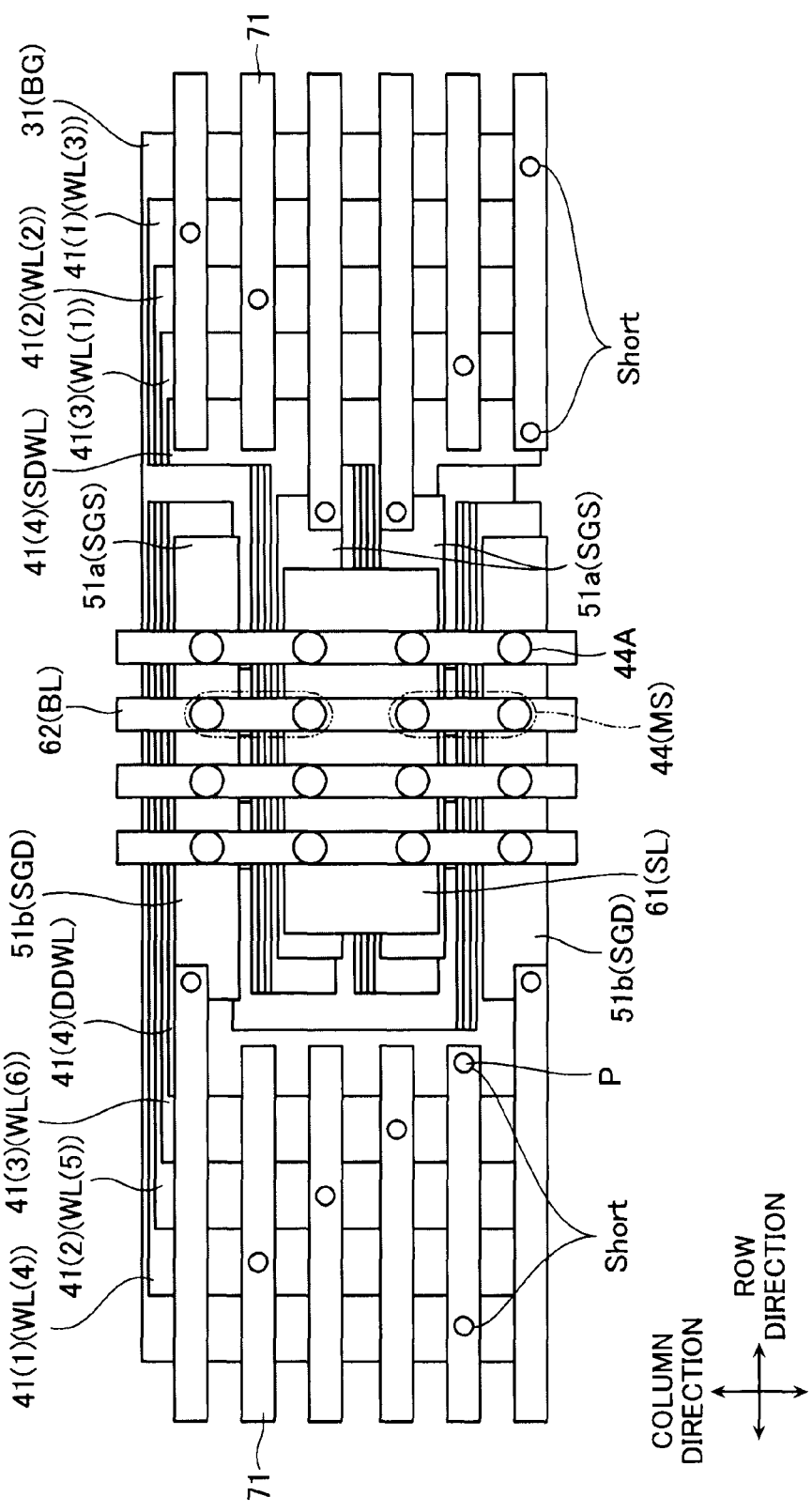
FIG. 15 is a top view of the third embodiment in the case of N=4 and M=2.

The top view of the third embodiment in the case of N=4 and M=2 is shown in FIG. 15. As shown in FIG. 15, one upper wiring layer 71 is needed for the back gate line BG and the dummy word line SDWL. One upper wiring layer 71 is needed for the back gate line BG and the dummy word line DDWL. Thus, the third embodiment can make the memory block MB smaller in size similar to the first and second embodiments. In the third embodiment, the read operation, the program operation and the first and third erase operations are performed similarly as in the second embodiment.

As shown in FIGS. 3 and 4, the back gate line BG (the back gate conductive layer 31) is formed at the lowermost side of the stack structure configuring the memory block MB. Thus, the back gate line BG may have as large a capacity as the substrate 20 below. Therefore, the back gate line BG needs a larger drive power than the word lines WL. For this, in the third embodiment, the upper wiring layers 71 are provided at both ends of the back gate line BG so that the back gate line BG is driven by the two upper wiring layers 71. Thus, the third embodiment can sufficiently drive the back gate line BG.

[Fourth Embodiment]

A nonvolatile semiconductor memory device according to a fourth embodiment will be described below. In the fourth embodiment, similar constituents to those in the first to third embodiments are denoted with like reference numerals and an explanation thereof will be omitted.

Figure 16:
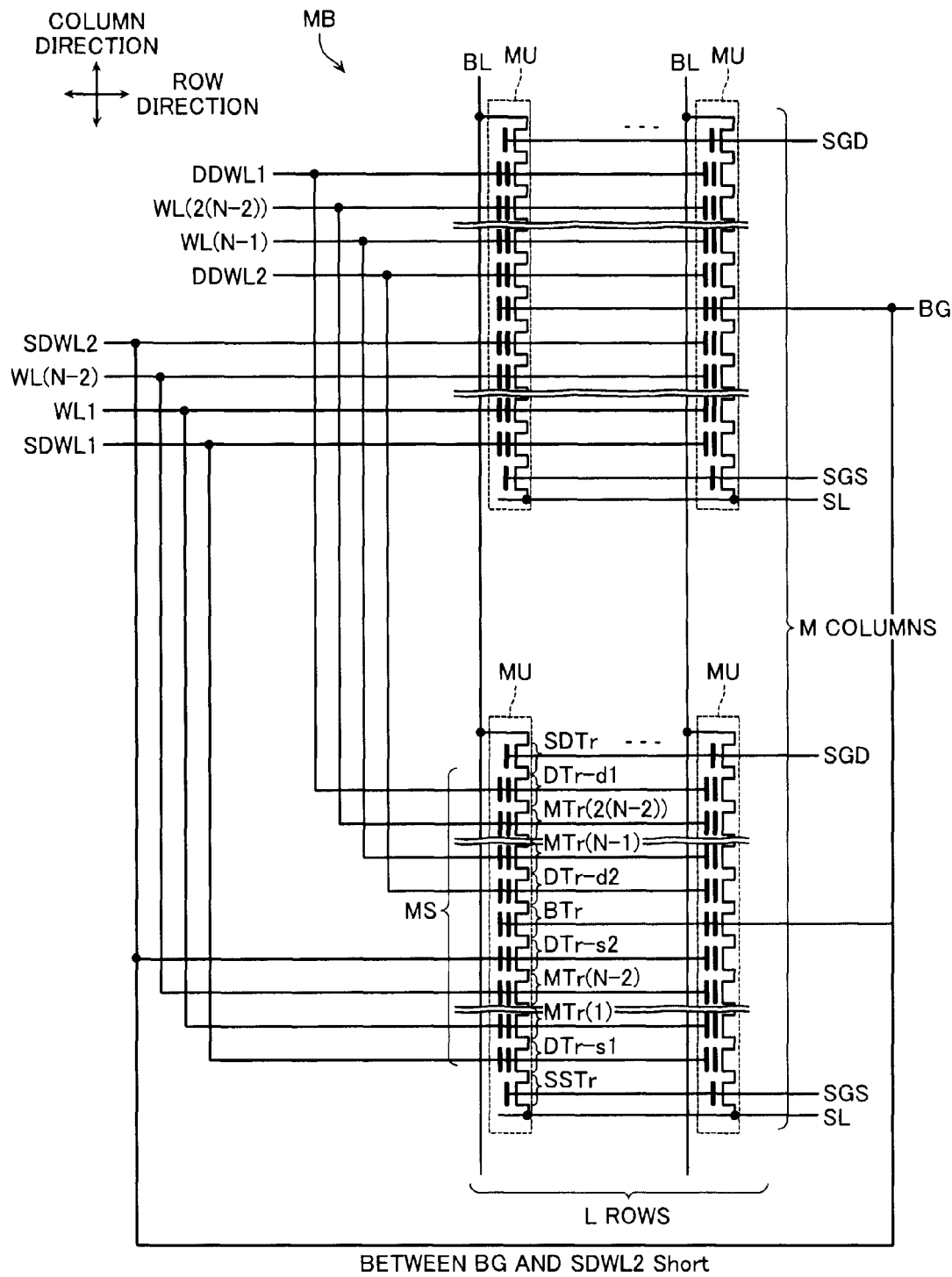
FIG. 16 is a circuit diagram of a memory block MB according to a fourth embodiment.

A circuit structure of the fourth embodiment will be first described with reference to FIG. 16. In the fourth embodiment, the memory string MS has memory transistors MTr(1) to MTr(2(N−2)), dummy transistors DTr-d1, DTr-d2, DTr-s1 and DTr-s2, and the back gate transistor BTr as shown in FIG. 16. The fourth embodiment is different from the first to third embodiments in this point. The dummy transistors DTr-d1, DTr-d2, DTr-s1 and DTr-s2 have substantially the same structure as the memory transistor MTr but are not used for storing data.

The dummy transistor DTr-s1, the memory transistors MTr(1) to MTr(2(N−2)), the dummy transistor DTr-s2, the back gate transistor BTr, the dummy transistor DTr-d2, the memory transistors MTr(N−1) to MTr(2(N−2)), and the dummy transistor DTr-d1 are connected in series in this order from the source line SL toward the bit line BL.

The gates of the dummy transistors DTr-d1 arranged in a matrix of L rows×M columns are commonly connected to a dummy word line DDWL1. The gates of the dummy transistors DTr-d2 arranged in a matrix of L rows×M columns are commonly connected to a dummy word lime DDWL2. The gates of the dummy transistors DTr-s1 arranged in a matrix of L rows×M columns are commonly connected to a dummy word line SDWL1. The gates of the dummy transistors DTr-s2 arranged in a matrix of L rows×M columns are commonly connected to a dummy word line SDWL2.

As shown in FIG. 16, the back gate line BG and the dummy word line SDWL2 are short-circuited.

In the fourth embodiment, the word line conductive layer 41(1) functions as the gates of the dummy transistors DTr-s2 and DTr-d2, and the dummy word lines SDWL2 and DDWL2. The word line conductive layers 41(2) to 41(N−1) function as the gates of the memory transistors MTr(1) to MTr(2(N−2)) and the word lines WL(1) to WL(2(N−2)). The word line conductive layer 41(N) functions as the gates of the dummy transistors DTr-s1 and DTr-d1, and the dummy word lines SDWL1 and DDWL1.

Figure 17:
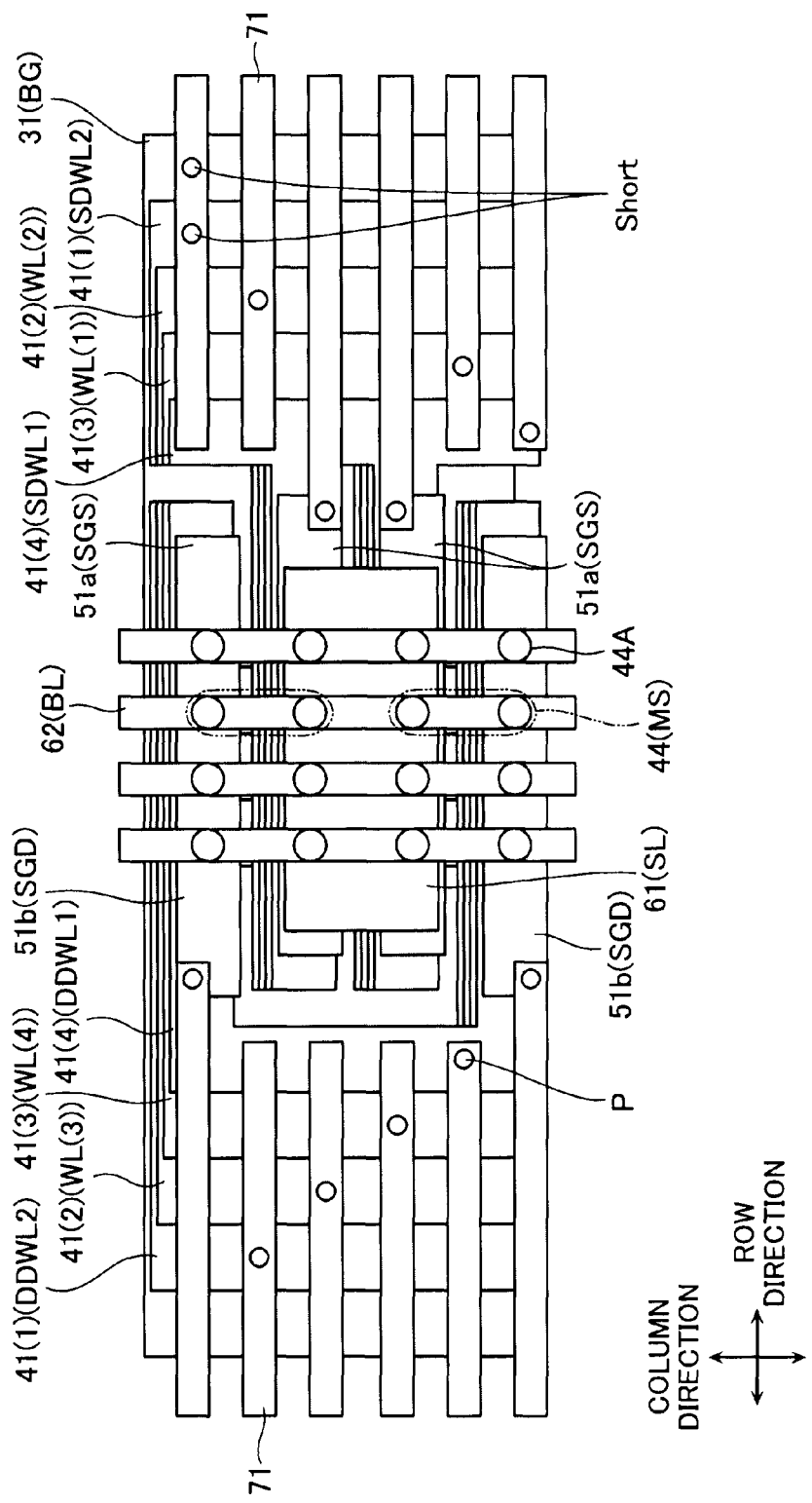
FIG. 17 is a top view of the fourth embodiment in the case of N=4 and M=2.

The back gate line BG and the dummy word line SDWL2 are short-circuited as described above. Thereby, the top view of the fourth embodiment in the case of N=4 and M=2 is shown in FIG. 17. Therefore, the fourth embodiment can also make the memory block MB smaller in size similarly as in the first to third embodiments as shown in FIG. 17.

[Others]

While certain embodiments of the inventions have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Figure 18:
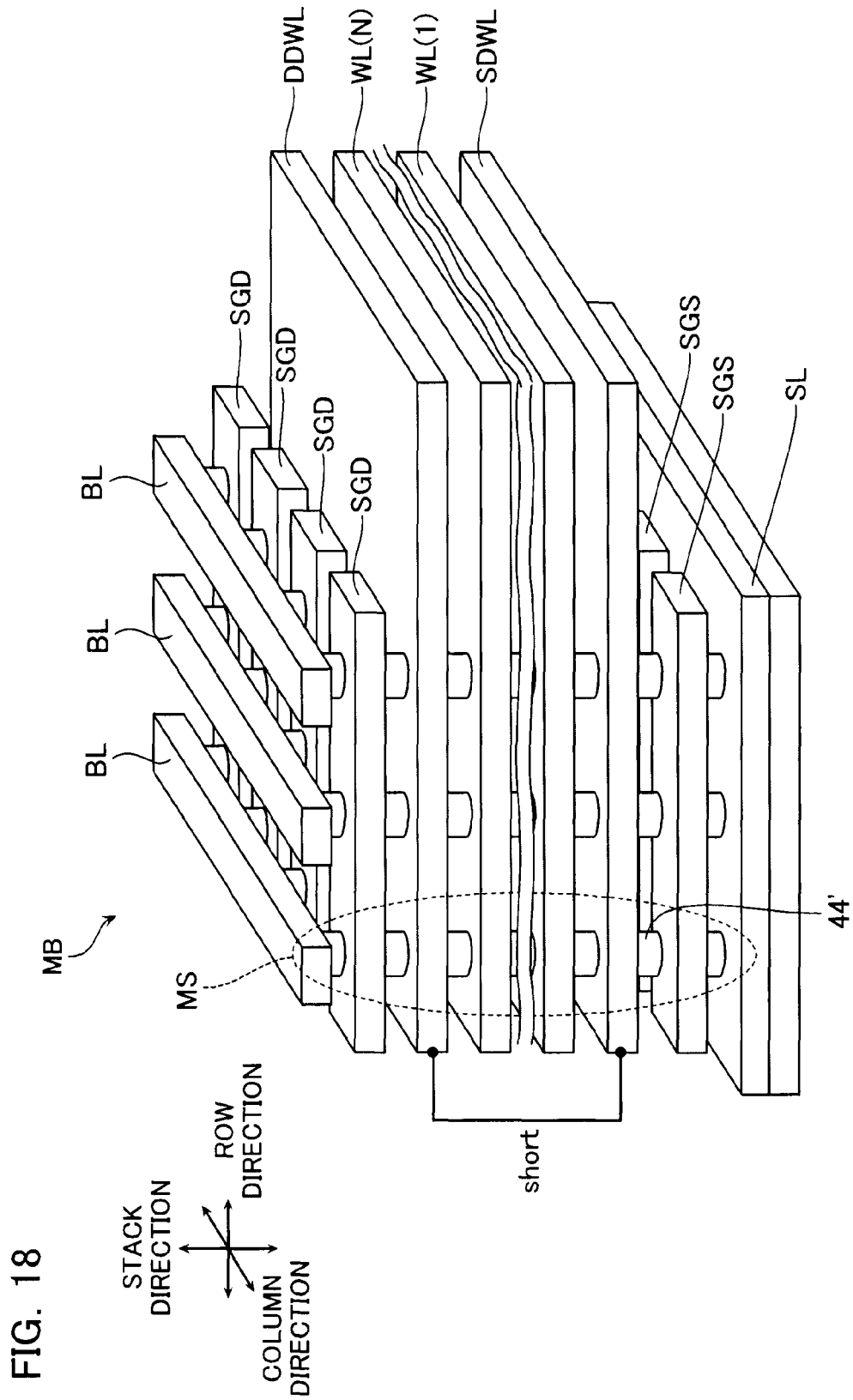
FIG. 18 is a schematic perspective view of a memory block MB according to other embodiment.

For example, the first to fourth embodiments have the memory semiconductor layer 44 having a U shape viewed in the column direction. However, as shown in FIG. 18, a memory semiconductor layer 44' having an I shape (column shape) viewed in the row direction and the column direction may be provided. In this case, the dummy word line SDWL and the dummy word line DDWL only need to be short-circuited.

For example, there has been described in the first to third embodiments the example in which the dummy transistors DTr-d and DTr-s are provided. However, the nonvolatile semiconductor memory device may have only one of the dummy transistors DTr-d and DTr-s.

There has been described in the first to third embodiments the example in which the dummy transistors DTr-d and DTr-s are connected to the ends of the memory string MS. The dummy transistors DTr-d and DTr-s may be positioned at the center of the memory string MS, for example.

Figure 19:
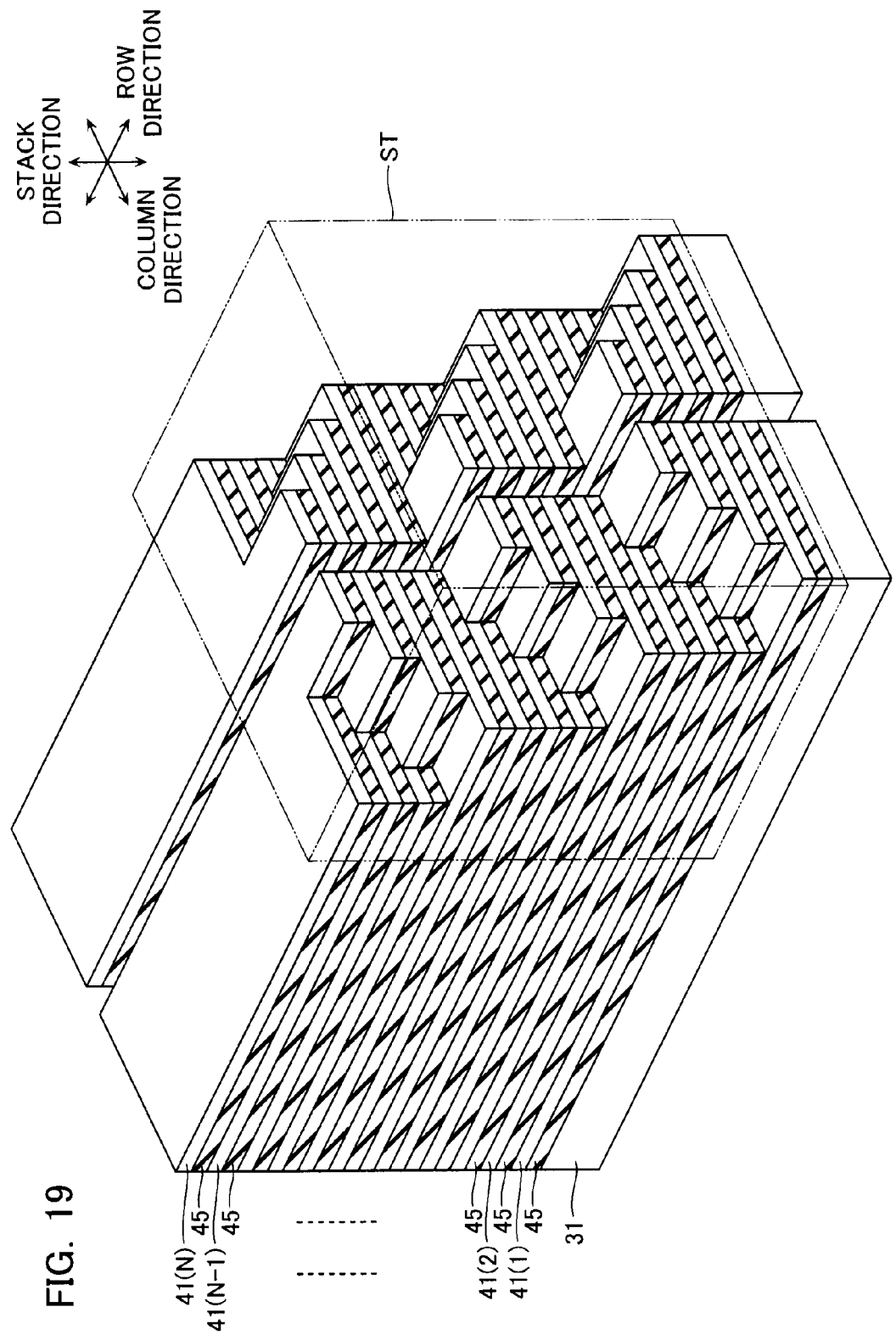
FIG. 19 is a schematic perspective view of a back gate conductive layer 31 and word line conductive layers 41(1) to 41(N) according to other embodiment.
Figure 20:
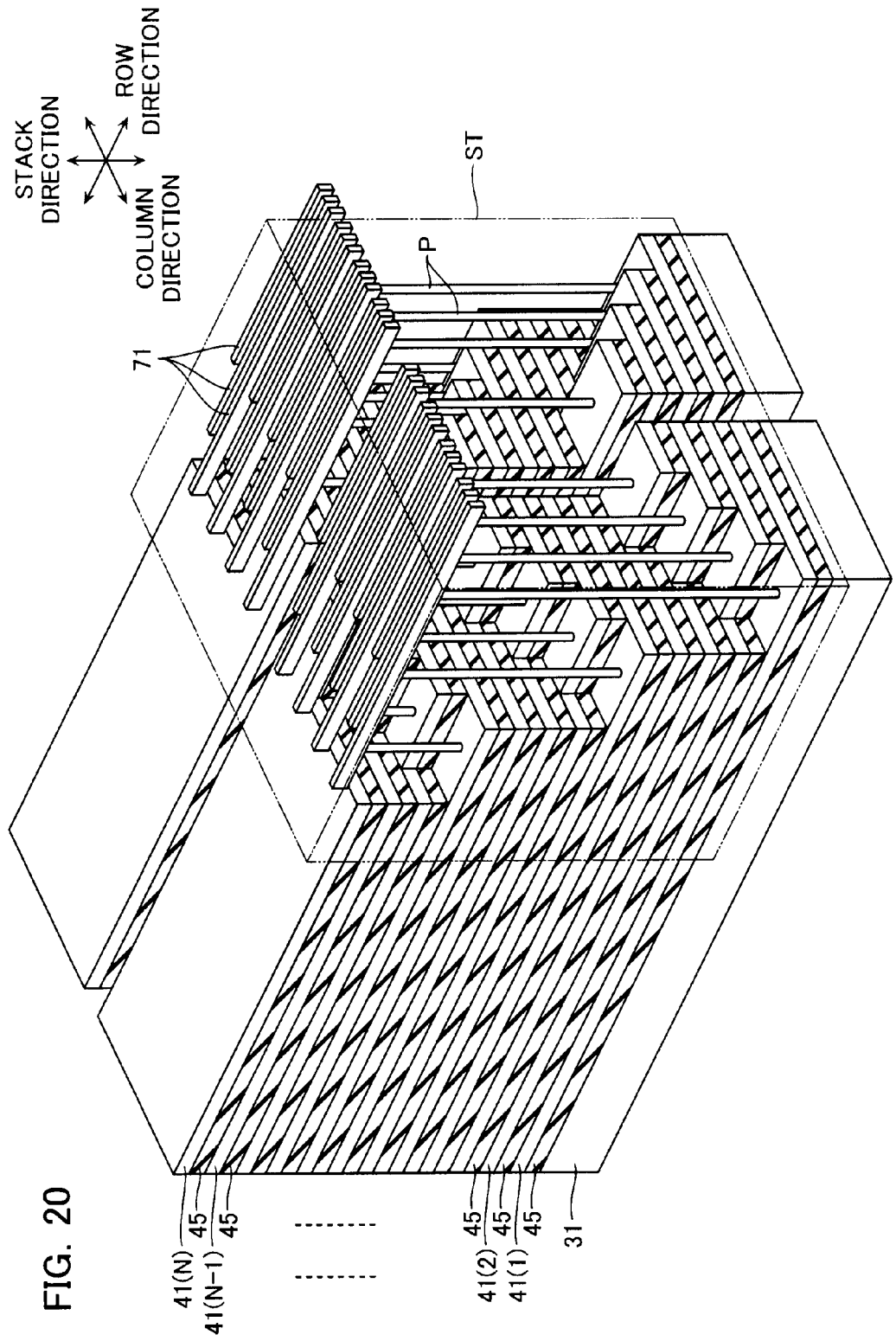
FIG. 20 is a schematic perspective view of a back gate conductive layer 31 and word line conductive layers 41(1) to 41(N) according to other embodiment.

FIGS. 19 and 20 show a schematic perspective view of a back gate conductive layer 31 and word line conductive layers 41(1) to 41(N) according to other embodiment. In FIG. 19, plug layers P and upper wiring layers 71 shown in FIG. 20 are omitted. As shown in FIGS. 19, 20, the word line conductive layers 41(1) to 41(N) may constitute a stairway portion ST formed stepwise such that ends of the word line conductive layers 41(1) to 41(N) are located at different positions in the row direction and the column direction. That is, the stairway portion ST may have steps arranged in a matrix formation. As shown in FIG. 20, the upper wiring layers 71 are electrically connected the steps via the plug layers P.

What is claimed is:

1. A nonvolatile semiconductor memory device comprising:
    a semiconductor substrate;
    a memory string having a plurality of memory cells, a dummy transistor and a back gate transistor connected in series in a direction perpendicular to the semiconductor substrate;
    a plurality of first conductive layers electrically connected to gates of the memory cells;
    a second conductive layer electrically connected to a gate of the dummy transistor; and
    a third conductive layer electrically connected to a gate of the back gate transistor,
    the second conductive layer being short-circuited with the third conductive layer.

2. The nonvolatile semiconductor memory device according to claim 1, wherein a pair of dummy transistors is provided in the memory string,
    a pair of second conductive layers is correspondingly provided in the same layer as the pair of dummy transistors, and
    at least one of the pair of second conductive layers is short-circuited with the third conductive layer.

3. The nonvolatile semiconductor memory device according to claim 2, wherein the pair of second conductive layers is short-circuited with the third conductive layer.

4. The nonvolatile semiconductor memory device according to claim 1, wherein two pairs of dummy transistors are provided in the memory string,
    one pair of second conductive layers is provided in a first layer for one pair of dummy transistors and another pair of second conductive layers is provided in a second layer different from the first layer for another pair of dummy transistors, and
    at least one of the two pairs of the second conductive layers is short-circuited with the third conductive layer.

5. The nonvolatile semiconductor memory device according to claim 1, wherein the second conductive layer is provided above the plurality of first conductive layers.

6. The nonvolatile semiconductor memory device according to claim 1, further comprising:
    upper wiring layers provided above the first conductive layers and the second conductive layer, and extending in parallel to the semiconductor substrate,
    a first plug layers electrically connects the second conductive layer and the upper wiring layer; and
    a second plug layers electrically connects the third conductive layer and the upper wiring layer.

7. The nonvolatile semiconductor memory device according to claim 6, comprising:
    a columnar semiconductor layer extending in a direction perpendicular to the semiconductor substrate,
    wherein the columnar semiconductor layer has a diameter of a first length,
    the first conductive layers and the second conductive layer each comprise a plurality of meshing parts each having a width of a second length twice the first length in a first direction parallel to the semiconductor substrate, and arranged at an interval of the first length in the first direction, and
    the upper wiring layers each have a width of the first length in the first direction and are arranged at an interval of the first length in the first direction.

8. The nonvolatile semiconductor memory device according to claim 1, wherein the memory string comprises:
    a pair of columnar semiconductor layers extending in a direction perpendicular to the semiconductor substrate and functioning as bodies of the memory cells and a body of the dummy transistor;
    a joining semiconductor layer joining lower ends of the pair of columnar semiconductor layers and functioning as a body of the back gate transistor; and
    a charge storage layer formed to surround the columnar semiconductor layers and the joining semiconductor layer,
    the plurality of first conductive layers are formed to surround the columnar semiconductor layers via the charge storage layer,
    the second conductive layer is formed to surround the columnar semiconductor layers via the charge storage layer, and
    the third conductive layer is formed to surround the joining semiconductor layer via the charge storage layer.

9. The nonvolatile semiconductor memory device according to claim 1, wherein the first conductive layers are formed stepwise such that ends of the first conductive layers are located at different positions in a first direction parallel to the semiconductor substrate.

10. The nonvolatile semiconductor memory device according to claim 1, wherein the first conductive layers, the second conductive layer and the third conductive layer include polysilicon.

11. The nonvolatile semiconductor memory device according to claim 8, wherein the columnar semiconductor layers and the joining semiconductor layer include polysilicon.

12. The nonvolatile semiconductor memory device according to claim 8, wherein the charge storage layer includes silicon nitride.

13. The nonvolatile semiconductor memory device according to claim 8, further comprising a block insulative layer provided between the charge storage layer, and the first conductive layers, the second conductive layer and the third conductive layer,
    wherein the block insulative layer includes silicon oxide.

14. The nonvolatile semiconductor memory device according to claim 8, further comprising a tunnel insulative layer provided between the charge storage layer, and the columnar semiconductor layer and the joining semiconductor layer,
    wherein the tunnel insulative layer includes silicon oxide.

15. The nonvolatile semiconductor memory device according to claim 1, further comprising:

a first select transistor connected at one end to one end of the memory string;

a second select transistor connected at one end to the other end of the memory string; and a control circuit configured to control a voltage to be given to the memory cells, the dummy transistor, the back gate transistor, the first select transistor and the second select transistor.

16. The nonvolatile semiconductor memory device according to claim 15, wherein, in an erase operation erasing data held by the memory cells, the control circuit generates a GIDL current by a potential difference between a gate of the first select transistor and the other end of the first select transistor, thereby increasing a potential of bodies of the memory cells.

17. The nonvolatile semiconductor memory device according to claim 16, wherein, in the erase operation, the control circuit generates a GIDL current by a potential difference between a gate of the second select transistor and the other end of the second select transistor, thereby increasing a potential of bodies of the memory cells.

18. The nonvolatile semiconductor memory device according to claim 16, wherein a plurality of memory strings are arranged in a matrix in a first direction parallel to the semiconductor substrate and in a second direction perpendicular to the first direction, gates of a plurality of first select transistors arranged in the first direction are commonly connected, gates of a plurality of second select transistors arranged in the first direction are commonly connected, and the control circuit selectively performs the erase operation to the memory cells arranged in the first direction.

19. The nonvolatile semiconductor memory device according to claim 6, wherein the number of the plurality of first conductive layers in each of memory blocks is N, the number of the plurality of memory strings arranged in a first direction parallel to the semiconductor substrate in each of the memory blocks is M, the upper wiring layers are provided at a pitch of 2F in the first direction, and N, M, and F satisfy a following equation $6F \times M \geqq 2F \times (N+M)$.

20. The nonvolatile semiconductor memory device according to claim 1, wherein the third conductive layer is provided below the plurality of first conductive layers.

* * * * *